United States Patent
Min et al.

(10) Patent No.: US 10,231,346 B2
(45) Date of Patent: Mar. 12, 2019

(54) DISPLAY DEVICE

(71) Applicant: LG ELECTRONICS INC., Seoul (KR)

(72) Inventors: Bumgi Min, Seoul (KR); Cheolsoo Kim, Seoul (KR); Mingeun Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/591,001

(22) Filed: May 9, 2017

(65) Prior Publication Data

US 2017/0347467 A1    Nov. 30, 2017

Related U.S. Application Data

(60) Provisional application No. 62/342,212, filed on May 27, 2016.

(30) Foreign Application Priority Data

Aug. 11, 2016 (KR) ........................ 10-2016-0102375

(51) Int. Cl.
| | |
|---|---|
| *H05K 5/02* | (2006.01) |
| *H05K 5/00* | (2006.01) |
| *G02F 1/1333* | (2006.01) |
| *G06F 1/16* | (2006.01) |
| *H04N 5/64* | (2006.01) |

(52) U.S. Cl.
CPC ..... *H05K 5/0017* (2013.01); *G02F 1/133308* (2013.01); *G06F 1/1601* (2013.01); *H05K 5/0247* (2013.01); *G06F 2200/1612* (2013.01); *H04N 5/64* (2013.01)

(58) Field of Classification Search
None
See application file for complete search history.

(56) References Cited

U.S. PATENT DOCUMENTS

| | | | |
|---|---|---|---|
| 8,773,848 B2* | 7/2014 | Russell-Clarke | ..... C03B 23/245 345/179 |
| 9,015,976 B2* | 4/2015 | Moon | ....................... G09F 9/30 40/729 |
| 9,125,298 B2* | 9/2015 | Russell-Clarke | ..... C03B 23/245 |
| 9,591,215 B1* | 3/2017 | Miller | ................ H04N 5/23241 |
| 2007/0218411 A1* | 9/2007 | Sakata | .................. G06F 1/1601 430/313 |
| 2010/0073591 A1 | 3/2010 | Choi et al. | |

(Continued)

FOREIGN PATENT DOCUMENTS

KR    1020160023234    3/2016

OTHER PUBLICATIONS

European Patent Office Application Serial No. 17172466.9, Search Report dated Oct. 23, 2017, 8 pages.

*Primary Examiner* — Xanthia C Cunningham
(74) *Attorney, Agent, or Firm* — Lee, Hong, Degerman, Kang & Waimey PC

(57) ABSTRACT

A display device is disclosed. The display device includes a display panel, a transparent back cover positioned at a rear of the display panel, a side frame positioned at a side of the display panel or the transparent back cover, and a cable electrically connected to the display panel and extended along the side frame.

17 Claims, 32 Drawing Sheets

(56) References Cited

U.S. PATENT DOCUMENTS

| | | | |
|---|---|---|---|
| 2011/0102726 A1* | 5/2011 | Nobeoka | G02F 1/13306 349/150 |
| 2011/0108684 A1 | 5/2011 | Roessler | |
| 2011/0222221 A1 | 9/2011 | Hsu et al. | |
| 2012/0281383 A1* | 11/2012 | Hwang | G02F 1/133308 361/807 |
| 2013/0050948 A1* | 2/2013 | Kim | G06F 1/263 361/715 |
| 2013/0170115 A1* | 7/2013 | Jung | G02F 1/00 361/679.01 |
| 2013/0188366 A1* | 7/2013 | Russell-Clarke | C03B 23/245 362/362 |
| 2014/0204328 A1* | 7/2014 | Kikuchi | G02F 1/133308 349/161 |
| 2014/0226082 A1* | 8/2014 | Campagna | H05K 5/02 348/836 |
| 2014/0305015 A1* | 10/2014 | Zelbacher | A47G 1/0622 40/714 |
| 2016/0234949 A1* | 8/2016 | Seo | H04M 1/0202 |
| 2016/0239121 A1* | 8/2016 | Murakami | G06F 3/044 |
| 2016/0364076 A1* | 12/2016 | Shimoda | G06F 3/044 |
| 2017/0139082 A1* | 5/2017 | Takai | G02B 1/113 |
| 2017/0139516 A1* | 5/2017 | Koike | G06F 3/0412 |
| 2017/0303048 A1* | 10/2017 | Hooton | H04R 17/005 |
| 2017/0318686 A1* | 11/2017 | Russell-Clarke | H05K 5/0017 |

\* cited by examiner

DISPLAY DEVICE

Pursuant to 35 U.S.C. § 119, this application claims the benefit of earlier filing date and right of priority to Korean Application No. 10-2016-0102375, filed on Aug. 11, 2016, and also claims the benefit of U.S. Provisional Application No. 62/342,212, filed on May 27, 2016, the contents of which are all incorporated by reference herein in their entirety.

BACKGROUND OF THE INVENTION

Field of the Invention

The present disclosure relates to a display device. More specifically, the present disclosure relates to a wiring structure or a frame structure of a transparent display device.

Discussion of the Related Art

With the development of the information society, various demands for display devices have been increasing. Various display devices, such as liquid crystal displays (LCDs), plasma display panels (PDPs), electroluminescent displays (ELDs), vacuum fluorescent displays (VFDs), and organic light emitting diode (OLED) displays, have been recently studied and used to meet various demands for the display devices.

An OLED display panel may display an image by depositing an organic material layer having self-emission structure on a substrate including transparent electrodes. The OLED display panel may be thin and flexible. Many studies on structural characteristics of display devices including the OLED display panel have been carried out.

SUMMARY OF THE INVENTION

Accordingly, an object of the present disclosure is to provide a cable wiring structure of a transparent display device.

Another aspect of the present disclosure is to provide a rigidity structure of a transparent display device.

Another aspect of the present disclosure is to provide an overlap structure of a plurality of cables.

In one aspect, there is provided a display device including a display panel, a transparent back cover at a rear of the display panel, a side frame at a side of the display panel or the transparent back cover, and a cable electrically connected to the display panel and extended along the side frame.

According to another aspect of the present disclosure, the cable may bend or fold on the side frame.

According to another aspect of the present disclosure, the side frame may include a first surface, a second surface opposite the first surface, and a passage passing through the first surface and the second surface. The cable may be extended from the first surface to the second surface through the passage.

According to another aspect of the present disclosure, the cable may bend or fold on the second surface.

According to another aspect of the present disclosure, the cable may be extended along the side frame in a range of an area of the second surface. The cable may be electrically connected to a control unit positioned at an end of the side frame.

According to another aspect of the present disclosure, the display device may further include a side frame cover coving the second surface of the side frame.

According to another aspect of the present disclosure, the side frame cover may be coupled to the side frame by a magnetic force.

According to another aspect of the present disclosure, the cable may include a plurality of cables, and at least a portion of each of the plurality of cables may be stacked on one another.

According to another aspect of the present disclosure, the side frame may include a first side frame and a third side frame coupled to the first side frame. The display panel or the transparent back cover may be positioned between the first side frame and the third side frame.

According to another aspect of the present disclosure, the display panel may include a member layer connected to a side of the display panel, a printed circuit board connected to the member layer, and a cable connected to the printed circuit board. The printed circuit board may be inserted between the first side frame and the third side frame.

According to another aspect of the present disclosure, the first side frame may include a first surface, a second surface opposite the first surface, and a passage connecting the first surface to the second surface. The printed circuit board may be positioned on the first surface, and the cable may be positioned on the second surface through the passage.

According to another aspect of the present disclosure, the cable may include a plurality of cables. The plurality of cables may not overlap one another on the first surface or the passage, and at least a portion of each of the plurality of cables may overlap one another and may be stacked on the second surface.

According to another aspect of the present disclosure, the plurality of cables may bend or fold on the second surface at least one time.

According to another aspect of the present disclosure, the display device may further include a first side frame positioned on a side of the display panel or the transparent back cover, a second side frame positioned on another side of the display panel or the transparent back cover, and a lower frame coupled to the first side frame and the second side frame and positioned at a lower part of the transparent back cover. The lower frame may be spaced apart from a bottom surface of the transparent back cover.

According to another aspect of the present disclosure, the passage may be formed adjacent to an external surface of the first side frame far away from a side of the display panel.

According to at least one aspect of the present disclosure, the present disclosure can provide a cable wiring structure of a transparent display device.

According to at least one aspect of the present disclosure, the present disclosure can provide a rigidity structure of a transparent display device.

According to at least one aspect of the present disclosure, the present disclosure can provide an overlap structure of a plurality of cables.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
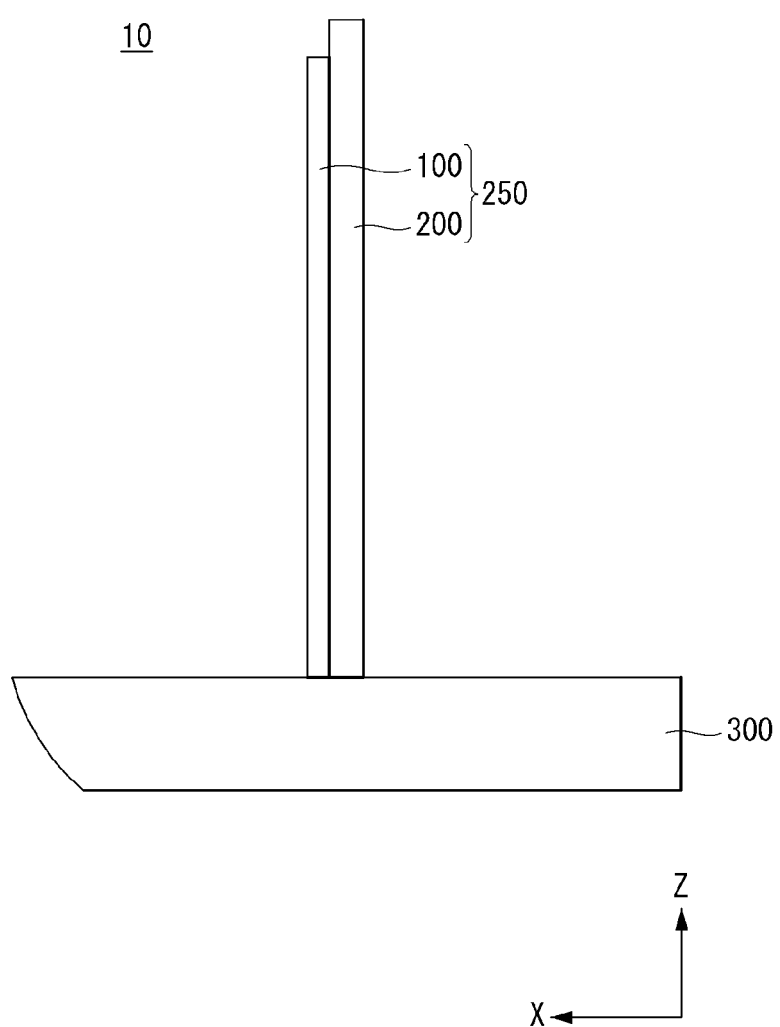
FIGS. 1, 2, 3, and 4 illustrate examples of a transparent display device according to an embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following embodiments of the invention are provided to those skilled in the art in order to describe the present invention more completely. Accordingly, shapes and sizes of elements shown in the drawings may be exaggerated for clarity.

Hereinafter, an embodiment of the invention is described using an organic light emitting diode (OLED) display panel as an example of a display panel. Other display panels may be used. For example, a plasma display panel (PDP), a field emission display (FED) panel, and a liquid crystal display panel may be used.

Referring to FIG. 1, a display unit 250 may include a display panel 100 and a back cover 200. The display panel 100 may be provided in front of a display device 10 and may display an image. The display panel 100 may divide the image into a plurality of pixels and may output the image while controlling color, brightness, and chroma of each pixel.

The back cover 200 may be provided at a back surface of the display panel 100. The back cover 200 may be directly attached to the display panel 100. Another component may be positioned between the display panel 100 and the back cover 200. The back cover 200 may have the same size as or may be larger than the display panel 100. The back cover 200 may support the back surface of the display panel 100. Hence, the back cover 200 may include a lightweight material having high rigidity.

A housing 300 may be positioned under the display unit 250. The housing 300 may support a lower part of the display unit 250, thereby preventing the display unit 250 from leaning to one side.

Figure 2:
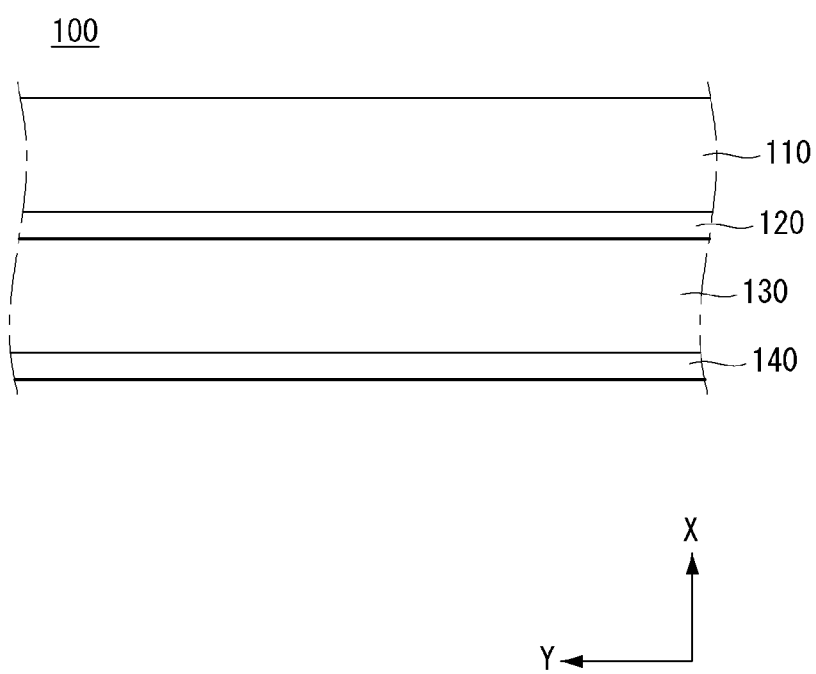

Referring to FIG. 2, the display panel 100 may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed.

The transparent substrate 110 and the upper electrode 120 may include a transparent material. The lower electrode 140 may include an opaque material. However, embodiments of the invention are not limited thereto. The lower electrode 140 may include a transparent material, for example, indium tin oxide (ITO). In this instance, light may be emitted from one surface of the lower electrode 140.

When a voltage is applied to the upper electrode 120 and the lower electrode 140, light emitted from the organic light emitting layer 130 may pass through the upper electrode 120 and the transparent substrate 110 and may be emitted to the outside. In this instance, a shielding plate may be added to the rear of the lower electrode 140, so that light emitted from the lower electrode 140 is emitted to the front of the display panel 100.

Figure 3:
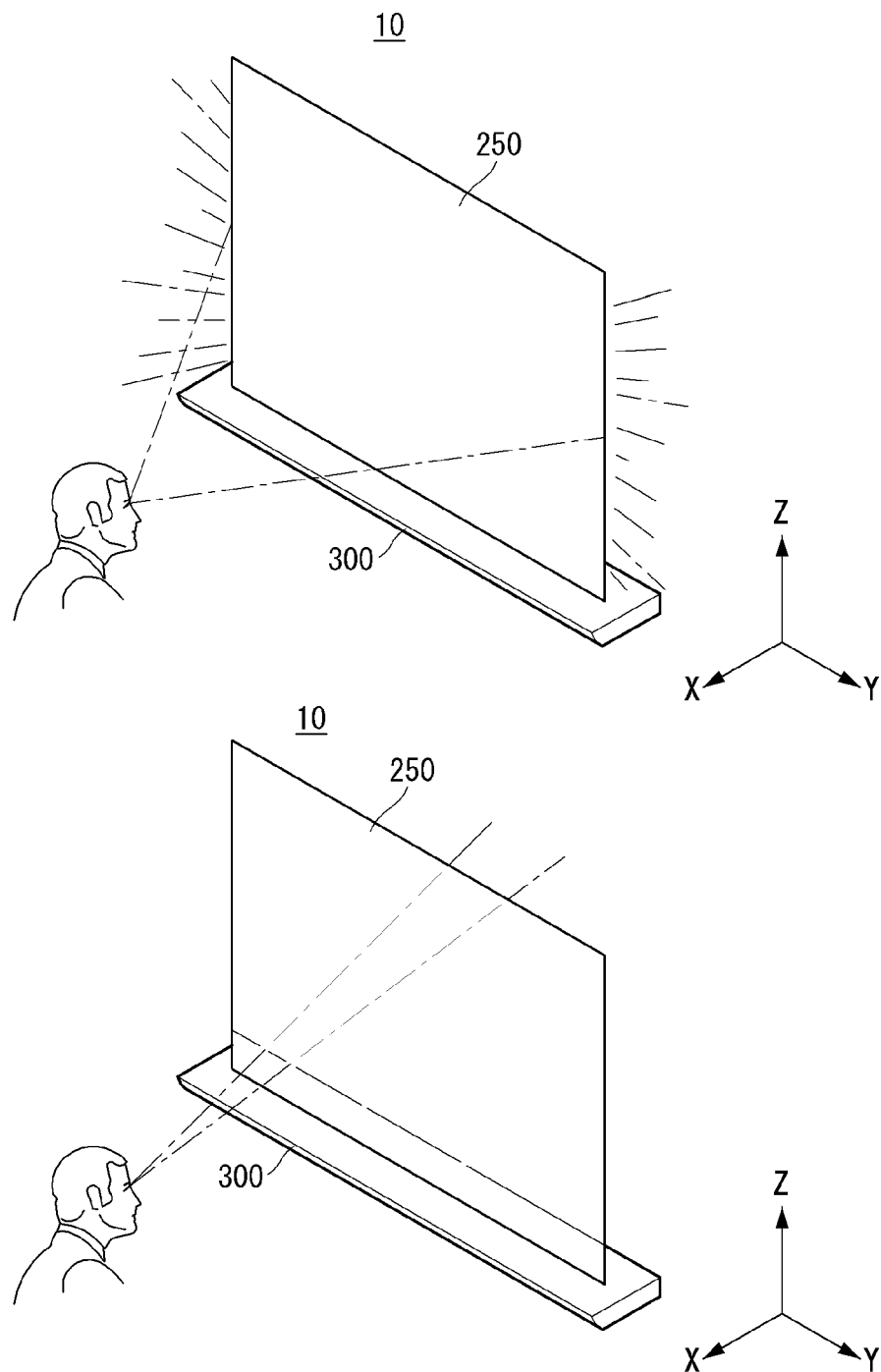

Referring to FIG. 3, the display unit 250 of the display device 10 according to the embodiment of the invention may include a transparent material. Namely, the back cover may include a transparent material. For example, the back cover may include glass or tempered glass.

A user may watch an image or a screen displayed on the display unit 250 when the display device 10 is driven. On the other hand, when the display device 10 is not driven, the user may observe background, that is at the rear of the display unit 250, through the display unit 250.

The display device 10 according to various embodiments of the invention may be transparent or translucent, and thus the other side of the display device 10 may be observed through the display device 10, and vice versa.

Figure 4:
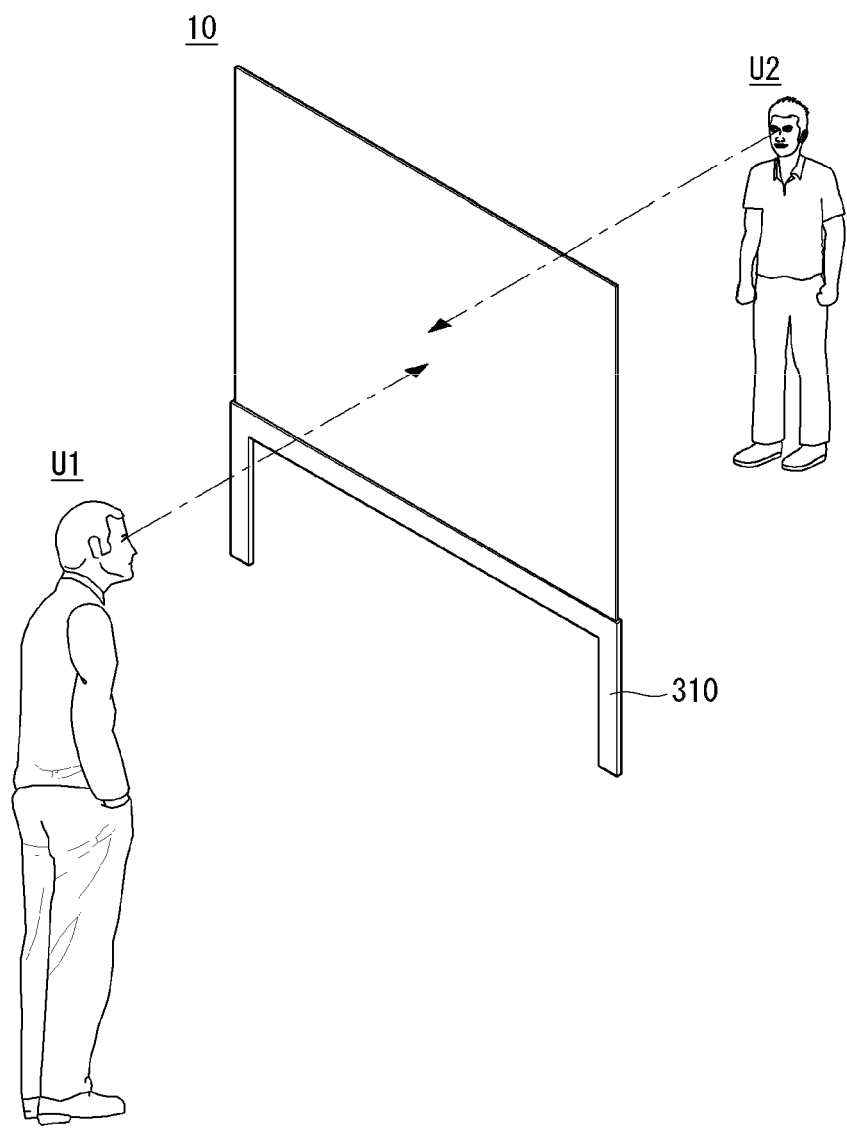

Referring to FIG. 4, the display device 10 may be positioned on a bracket 310. The display device 10 may be positioned between two spaces respectively occupied by users U1 and U2. For example, the display device 10 may be used in a state where it is not attached to a wall.

In such an installed state of the display device 10, the users U1 and U2 may observe both a front side and a back side of the display device 10. Namely, the first user U1 may observe the display device 10 at the front side of the display device 10, and the second user U2 may observe the display device 10 at the back side of the display device 10.

At least a portion of the display device 10 may be in a transparent state. Thus, the first user U1 positioned in front (i.e., at the front side) of the display device 10 may observe the second user U2 positioned in the rear (i.e., at the back side) of the display device 10 through the display device 10.

Figure 5:
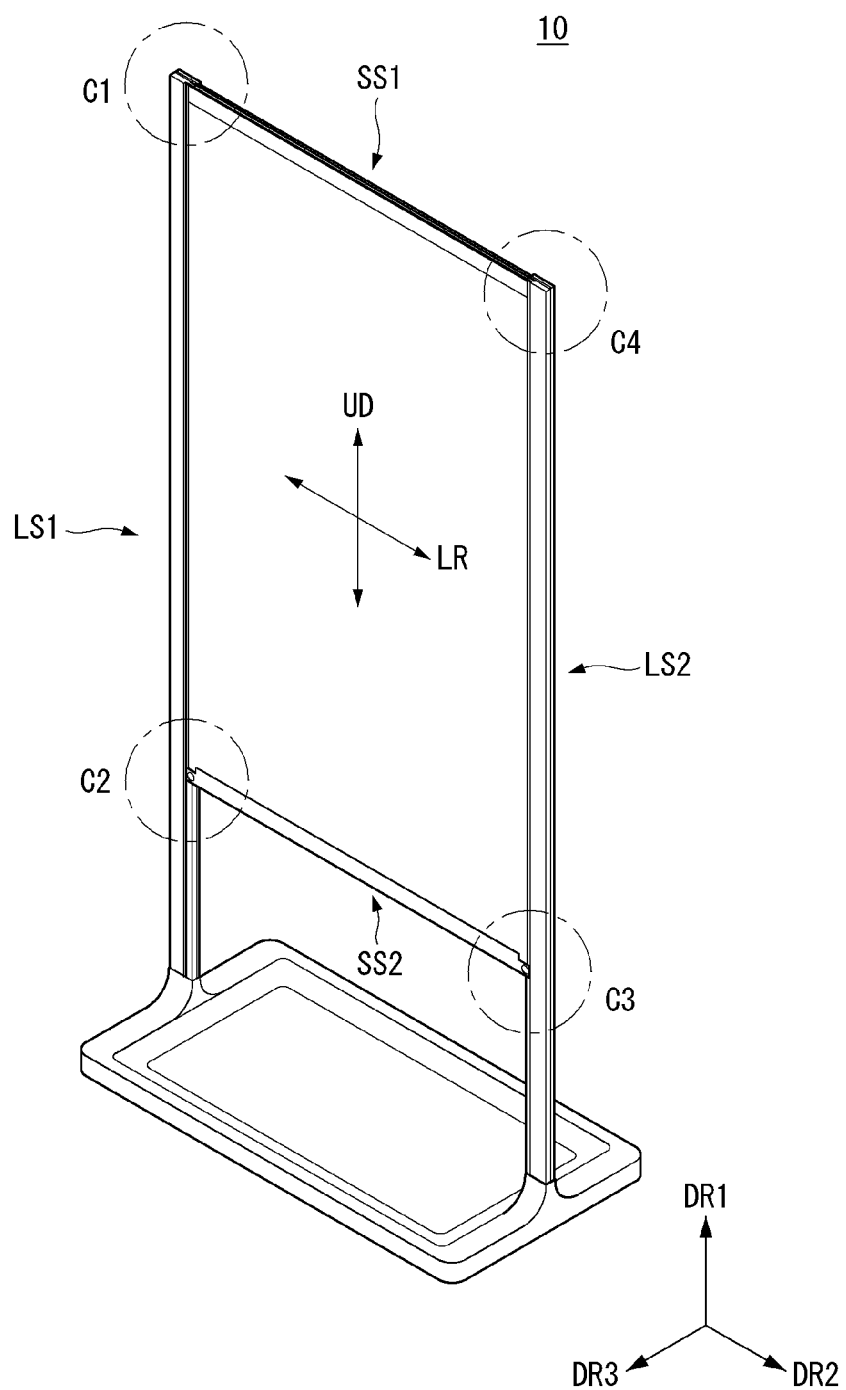
FIG. 5 illustrates an example of a display device according to an embodiment of the invention.

Referring to FIG. 5, a display device may include a first long side LS1, a second long side LS2 opposite the first long side LS1, a first short side SS1 adjacent to one end of the first long side LS1 and one end of the second long side LS2, and a second short side SS2 opposite the first short side SS1.

In embodiments disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

Embodiments of the invention describe that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device.

A third direction DR3 may be a direction perpendicular to the first direction DR1 and/or the second direction DR2.

In embodiments disclosed herein, the first direction DR1 and the second direction DR2 may be commonly referred to as a horizontal direction. Further, the third direction DR3 may be referred to as a vertical direction.

The first short side SS1 may be referred to as an upper side or an upper surface, and the second short side SS2 may be referred to as a lower side or a lower surface. Further, the first long side LS1 may be referred to as a left side or a left surface, and the second long side LS2 may be referred to as a right side or a right surface.

On the contrary, the first short side SS1 may be referred to as a lower side or a lower surface, and the second short side SS2 may be referred to as an upper side or an upper surface. Further, the first long side LS1 may be referred to as a right side or a right surface, and the second long side LS2 may be referred to as a left side or a left surface.

Further, the first long side LS1, the second long side LS2, the first short side SS1, and the second short side SS2 may be referred to as edges of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as an up-down direction UD. A direction from the first long side LS1 to the second long side LS2 or from the second long side LS2 to the first long side LS1 may be referred to as a left-right direction LR.

Figure 6:
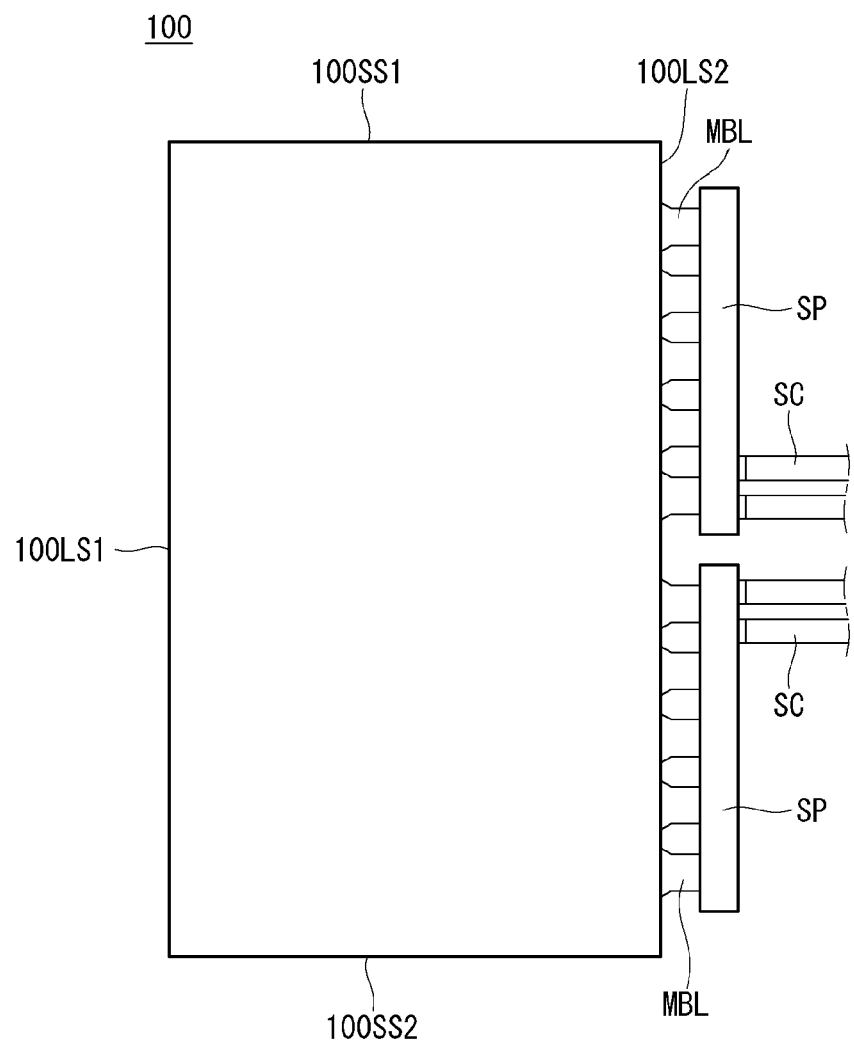
FIGS. 6, 7, 8, 9, 10A, 10B, 10C, 11, 12, 13, 14A, 14B, 15, 16, and 17 illustrate examples of a coupling relationship between components of a display device according to an embodiment of the invention.

Referring to FIG. 6, a display panel 100 may display an image on one surface of the display panel 100. The display panel 100 may divide the image into a plurality of pixels and may output the image while controlling color, brightness, and chroma of each pixel. The display panel 100 may generate light corresponding to at least one of red, green, and blue colors in response to a control signal.

A member layer MBL may be connected to one side of the display panel 100. For example, the member layer MBL may be extended from a first long side 100LS1 of the display panel 100. The member layer MBL may include at least one of a chip-on film (COF), a chip-on glass (COG), a flexible printed circuit board (FPCB), wire, and a tape carrier package (TCP). The member layer MBL may be flexible. The member layer MBL may be configured as a plurality of member layers. The member layer MBL may be electrically connected to the display panel 100. The member layer MBL may supply electric power to the display panel 100. The pixels of the display panel 100 may be controlled by electric current that is supplied to the display panel 100 through the member layer MBL.

A cable SC may be electrically connected to the display panel 100. The cable SC may supply the electric current to the display panel 100. The cable SC may supply an electric signal controlling the pixels of the display panel 100 to the display panel 100. The cable SC may be electrically connected to the member layer MBL.

A printed circuit board (PCB) SP may be electrically connected to the member layer MBL. The PCB SP may be electrically connected to the cable SC. The PCB SP may be relatively larger or thicker than the member layer MBL and/or the cable SC.

The PCB SP may occupy a predetermined volume at one side of the display panel 100. A thickness of the PCB SP may vary depending on a kind and/or an arrangement and/or a shape of electronic elements mounted on the PCB SP. The PCB SP may be a source PCB.

Figure 7:
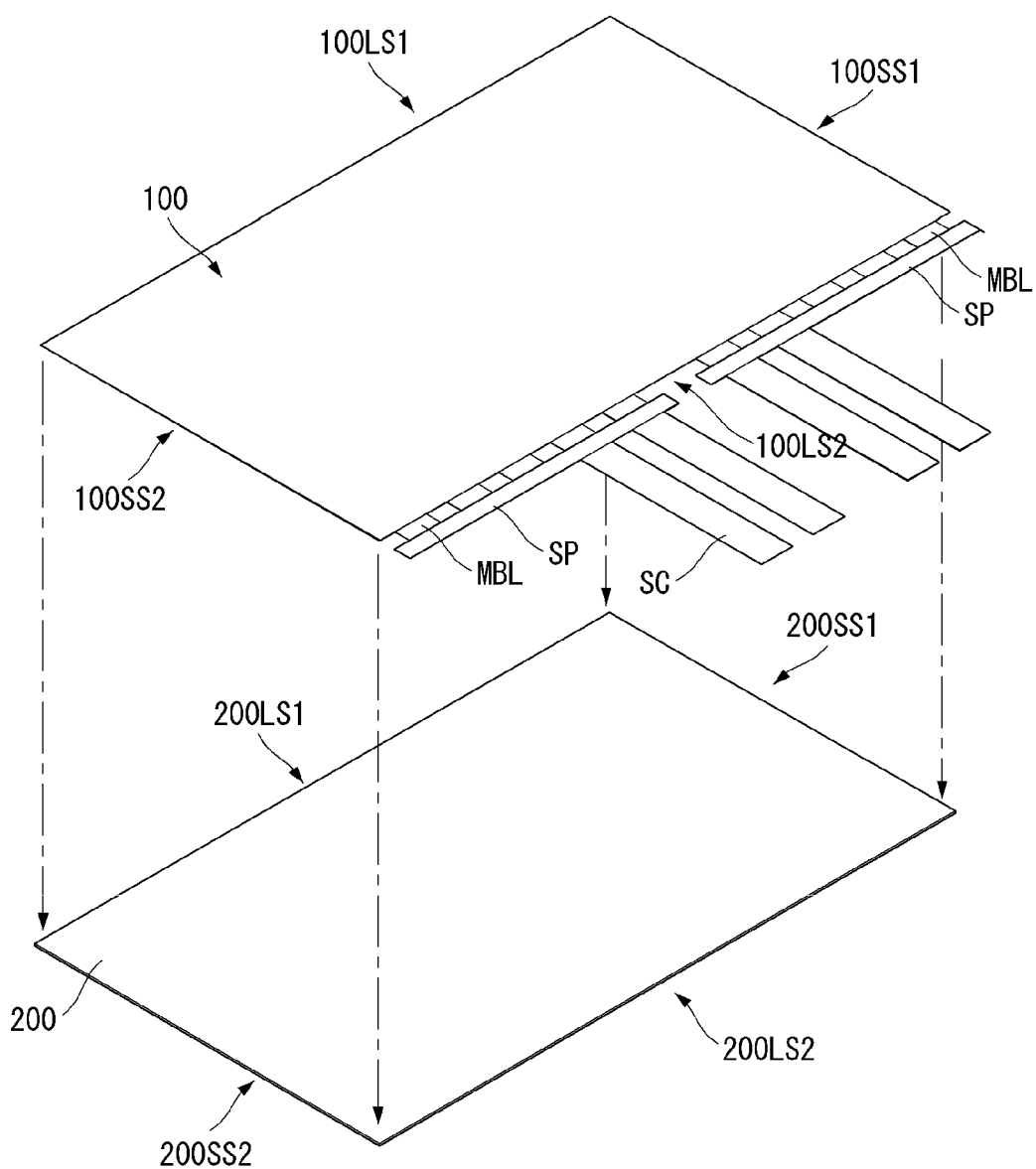

Referring to FIG. 7, the display panel 100 may be positioned on one surface of a back cover 200. The display panel 100 may be fixed or attached to one surface of the back cover 200. The back cover 200 may support the display panel 100. For example, the display panel 100 may be a transparent display panel or a light transmitting display panel. The back cover 200 may include a transparent material or a light transmitting material, for example, glass or transparent plastic.

The member layer MBL connected to one side of the display panel 100 may be positioned adjacent to one side of the back cover 200. The member layer MBL may be positioned at an edge of one side of the back cover 200. The PCB SP may be positioned outside the back cover 200.

The member layer MBL may be electrically connected to a second long side 100L52 of the display panel 100. The second long side 100L52 of the display panel 100 may be positioned adjacent to a second long side 200LS2 of the back cover 200. In this instance, the member layer MBL may be extended from the second long side 100L52 of the display panel 100 to the outside of the back cover 200 via the second long side 200LS2 of the back cover 200.

Figure 8:
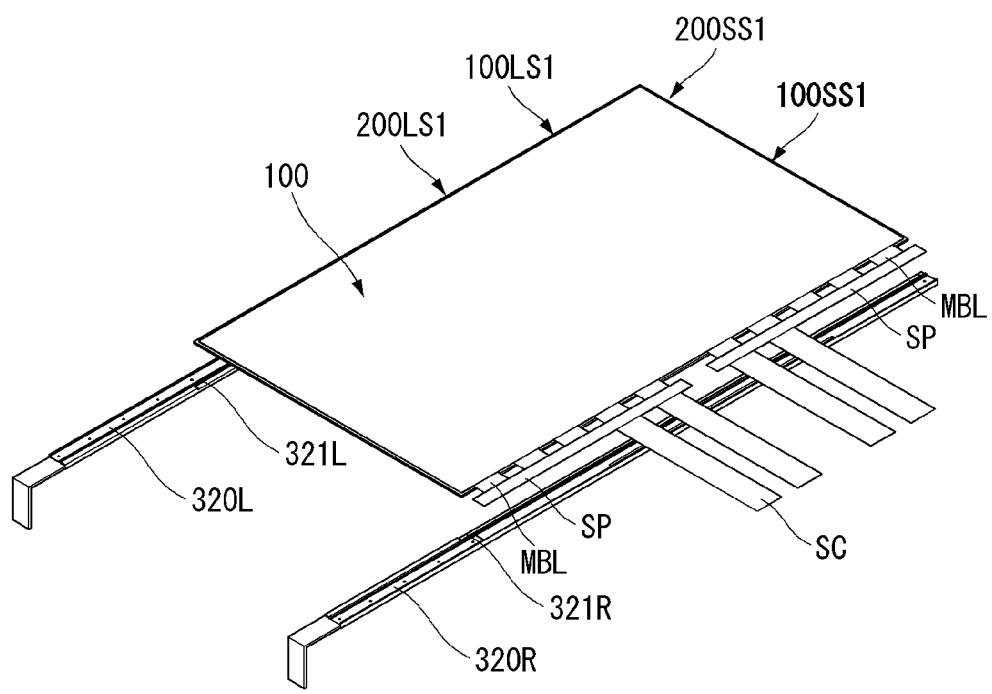

Referring to FIG. 8, a plurality of side frames 320R and 320L may be provided. The plurality of side frames 320R and 320L may include a first side frame 320R and a second side frame 320L.

The first side frame 320R may be positioned on one side of the display panel 100 or the back cover 200, and the second side frame 320L may be positioned on the other side of the display panel 100 or the back cover 200. The first side frame 320R and the second side frame 320L may be respectively positioned on both sides of the display panel 100 or the back cover 200.

The side frames 320R and 320L may respectively include grooves 321R and 321L. The grooves 321R and 321L may be formed at one side or one edge of the side frames 320R and 320L. One surface of each of the side frames 320R and 320L may be stepped by the grooves 321R and 321L.

The first side frame 320R or the second side frame 320L may include the grooves 321R and 321L having a length corresponding to a length of one side of the back cover 200. The grooves 321R and 321L may be formed to be extended along one surface of the first side frame 320R or the second side frame 320L.

The back cover 200 may be coupled to the first side frame 320R or the second side frame 320L. The back cover 200 may be positioned in the groove 321R of the first side frame 320R and/or the groove 321R of the second side frame 320L.

Figure 9:
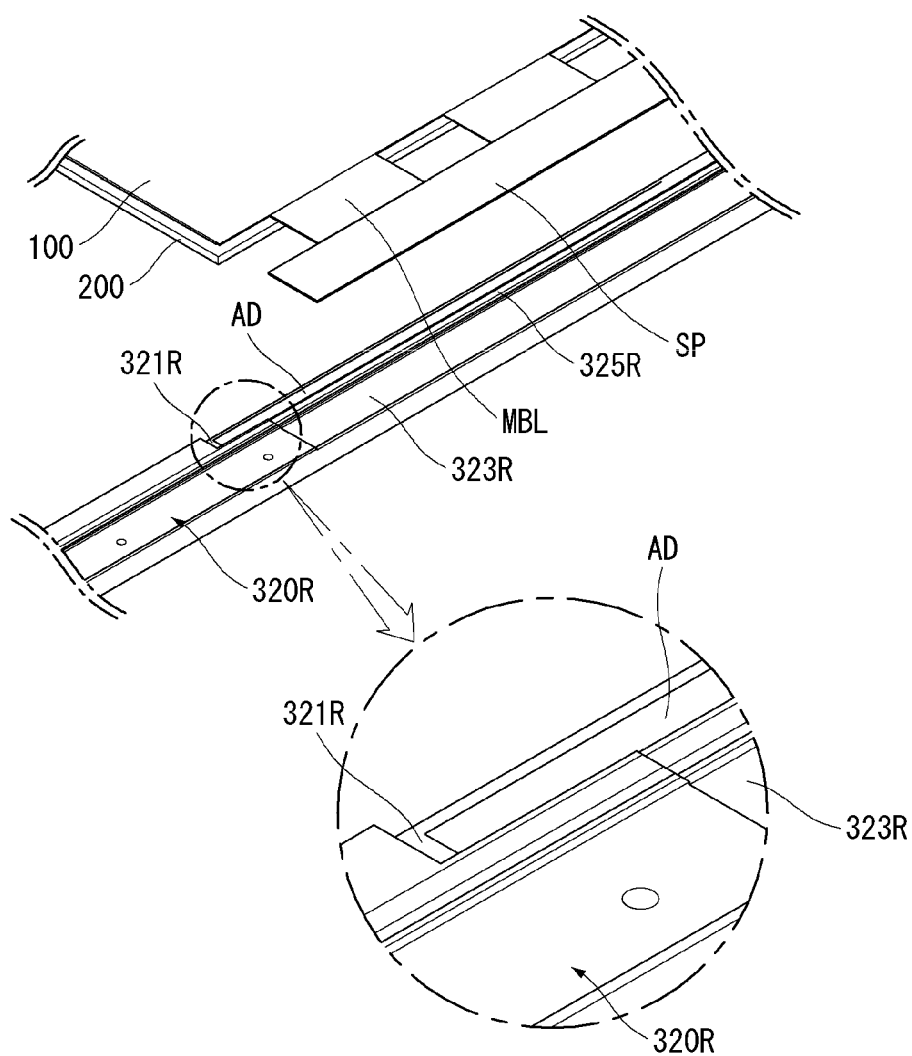
Figure 10A:
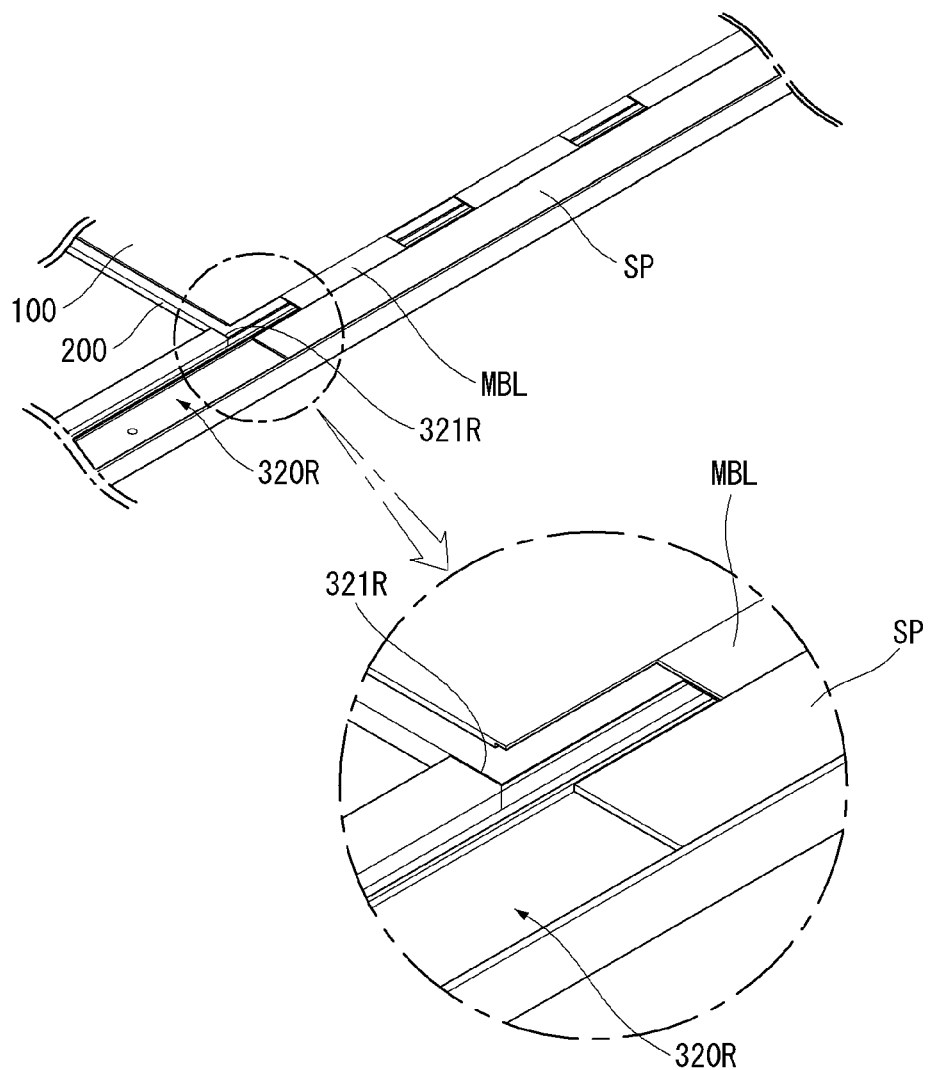

Referring to FIGS. 9 and 10A, a coupling member AD may be positioned in the groove 321R. For example, the coupling member AD may be a double-sided tape. The back cover 200 may be attached to the coupling member AD and coupled to the side frame 320R. The coupling member AD may be positioned in the groove 321R along a longitudinal direction of the side frame 320R. The coupling member AD may be referred to as an adhesive member.

Figure 10B:
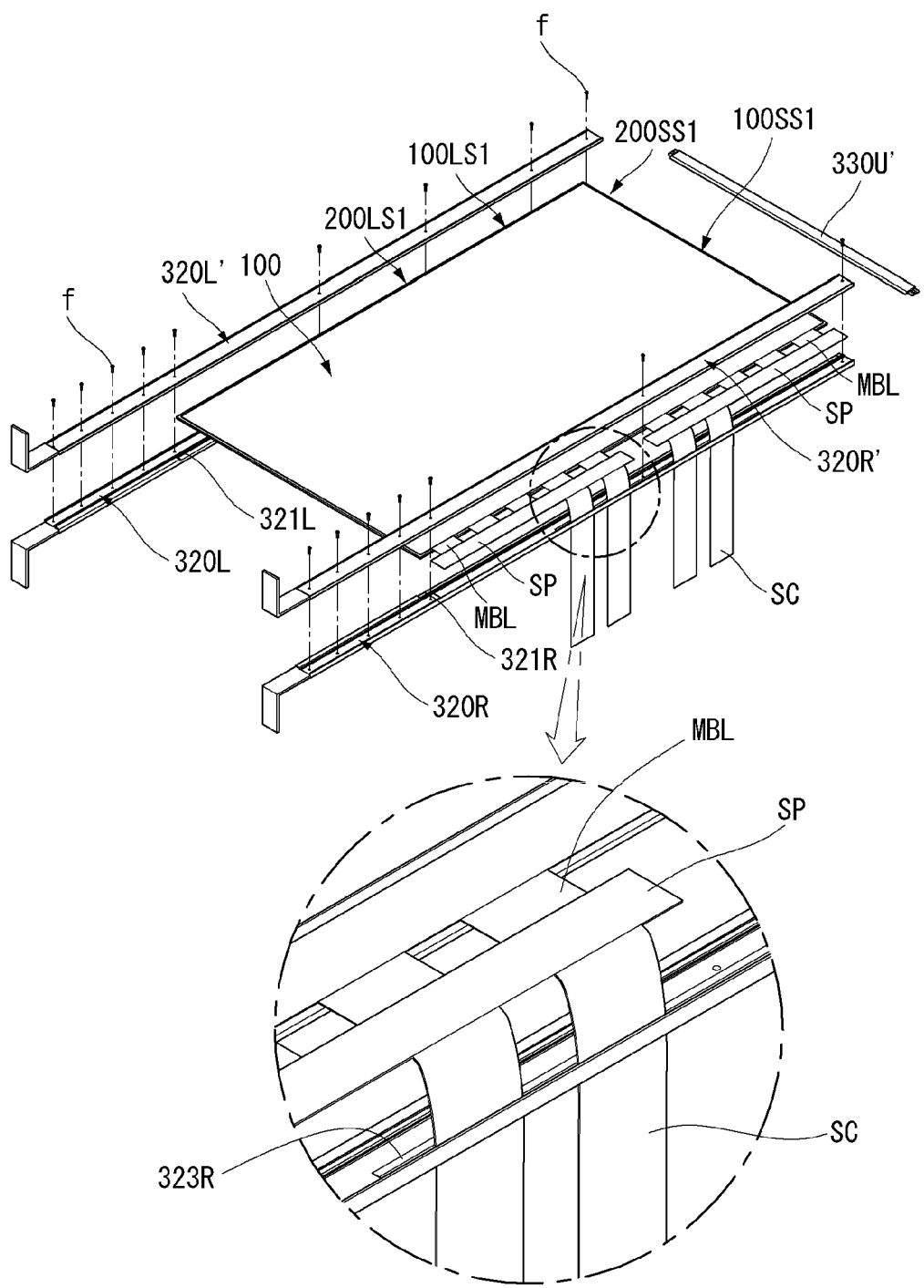

Referring to FIG. 10B, a third side frame 320R' may be coupled to the first side frame 320R. The back cover 200 and/or the display panel 100 may be positioned between the first side frame 320R and the third side frame 320R'. The back cover 200 and/or the display panel 100 may be fixed between the first side frame 320R and the third side frame 320R'. The first side frame 320R may be coupled to the third side frame 320R' by coupling members 'f'.

The first side frame 320R may have a passage 323R. The passage 323R may be formed to be extended along the first side frame 320R. The passage 323R may form a slit that is long and thin along a longitudinal direction of the first side frame 320R. The cable SC may be inserted into the passage 323R. The cable SC may pass through the first side frame 320R via the passage 323R.

Further, a fourth side frame 320L' may be coupled to the second side frame 320L. The back cover 200 and/or the display panel 100 may be positioned between the second side frame 320L and the fourth side frame 320L'. The back cover 200 and/or the display panel 100 may be fixed between the second side frame 320L and the fourth side frame 320L'. The second side frame 320L may be coupled to the fourth side frame 320L' by coupling members 'f'.

An upper frame 330U' may connect the third side frame 320R' to the fourth side frame 320L'. The upper frame 330U' may be fastened to the third side frame 320R' and the fourth side frame 320L'. The upper frame 330U' may be referred to as a first upper frame.

Hence, the back cover 200 and/or the display panel 100 may be strongly coupled to the first to fourth side frames 320R, 320L, 320R', and 320L'.

Figure 10C:
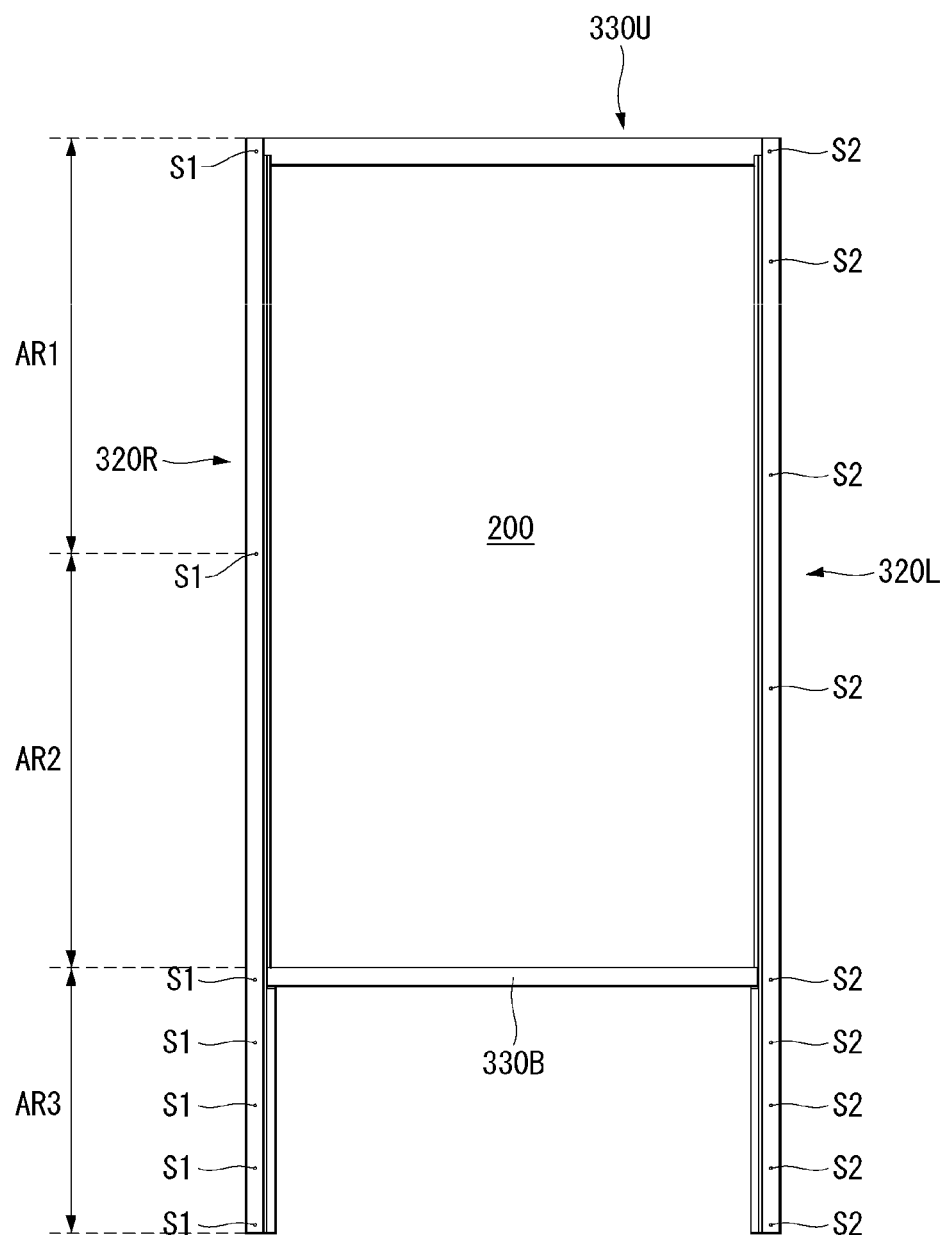

Referring to FIG. 10C, coupling members S1 and S2 may be inserted into the side frames 320R, 320L, 320R', and 320L'. For example, the coupling members S1 and S2 may be screws. A plurality of first coupling members S1 may be inserted into the first side frame 320R, and a plurality of second coupling members S2 may be inserted into the second side frame 320L. In embodiments of the invention, the number of first coupling members S1 may be different from the number of second coupling members S2.

This may be caused because the PCB SP is disposed on the first side frame 320R or the second side frame 320L. In another point of view, this may be caused because wires of the cable SC or the plurality of cables SC are arranged on the first side frame 320R or the second side frame 320L.

For example, when the PCB SP is disposed in a first area AR1 or a second area AR2 of the first side frame 320R, the coupling member S1 may not be disposed in the first area AR1 or the second area AR2 of the first side frame 320R.

As another example, when the PCB SP is disposed in the first area AR1 or the second area AR2 of the first side frame 320R, the number of first coupling members S1 may be less than the number of second coupling members S2.

Figure 11:
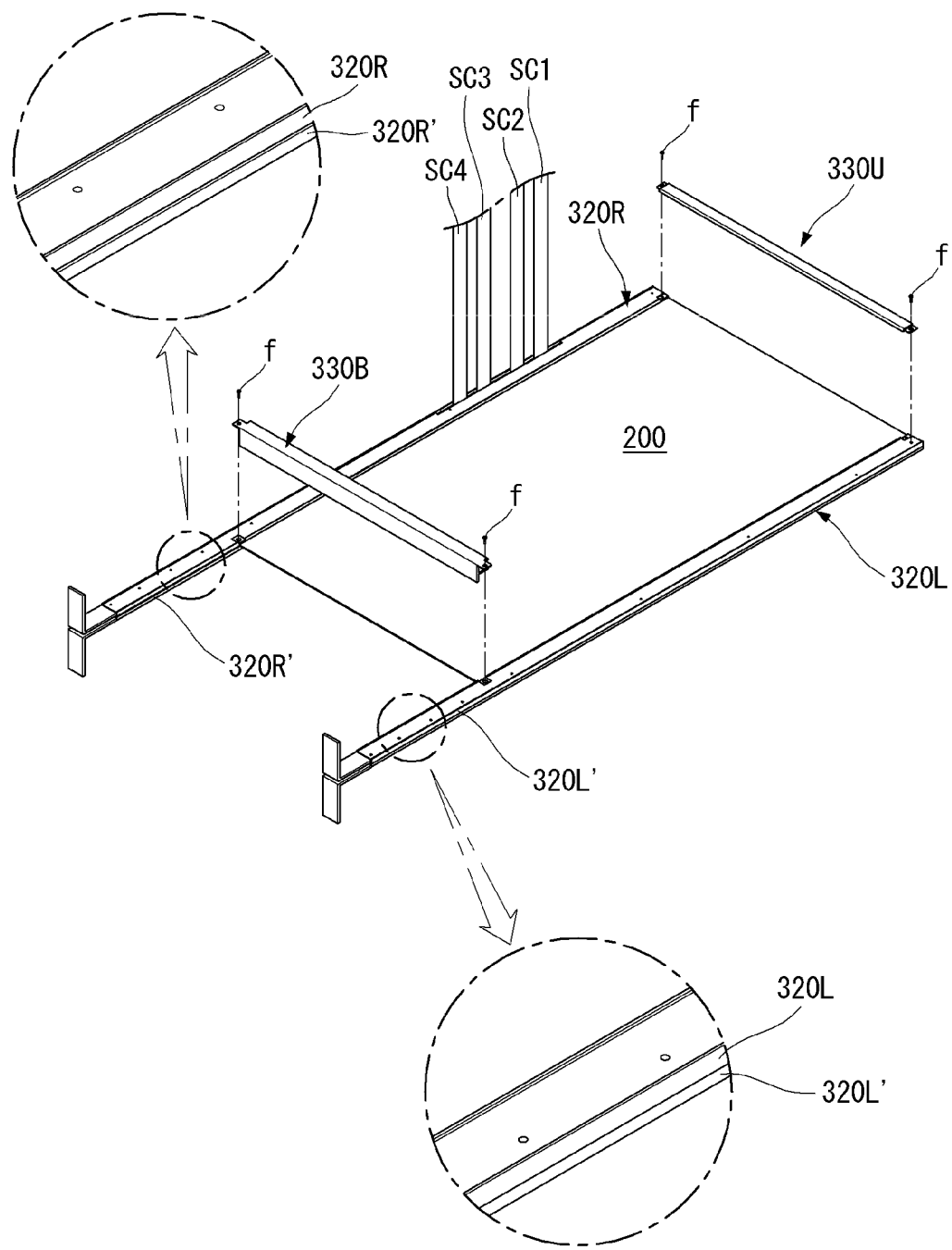

Referring to FIG. 11, an upper frame 330U may be positioned at an upper side of the display panel 100 or the back cover 200. The upper frame 330U may be coupled to the side frames 320R and 320L. The upper frame 330U may be coupled to upper ends of the first and second side frames 320R and 320L or coupled adjacent to the upper ends. The upper frame 330U may be referred to as a second upper frame.

A bottom frame 330B may be positioned at a lower side of the display panel 100 or the back cover 200. The bottom frame 330B may be coupled to the side frames 320R and 320L. The bottom frame 330B may be coupled to lower ends of the first and second side frames 320R and 320L or coupled adjacent to the lower ends.

The upper frame 330U or the bottom frame 330B may be coupled to the first side frame 320R and/or the second side frame 320L by fastening members 'f'.

Figure 12:
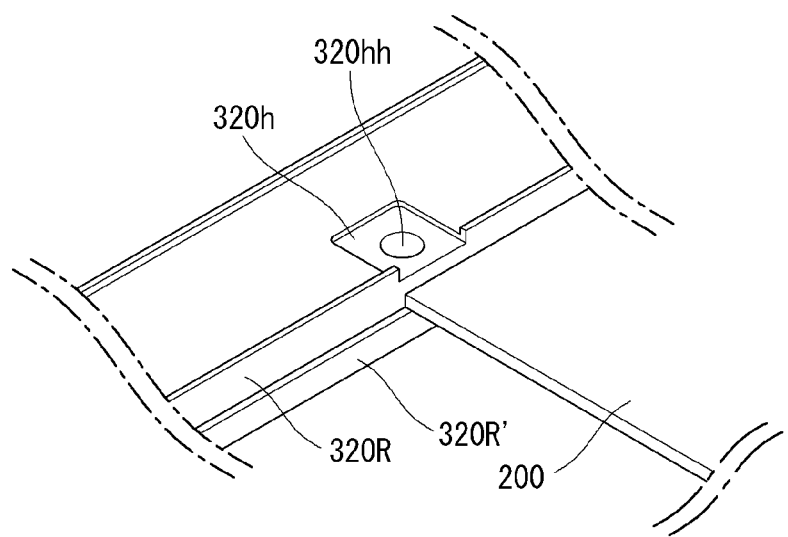
Figure 13:
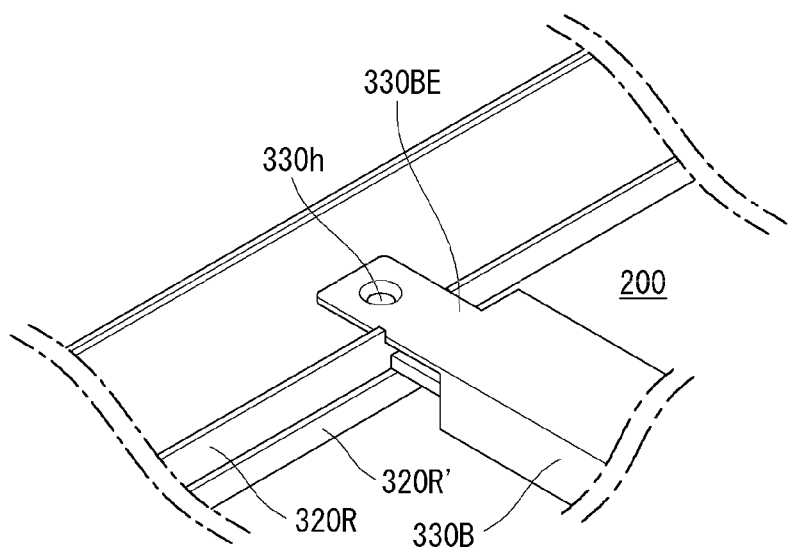

Referring to FIGS. 12 and 13, a side frame 320R may include a groove 320h. The groove 320h may be formed in a center portion or a lower portion of the side frame 320R. The groove 320h of the side frame 320R may be positioned adjacent to a lower end of the display panel 100 or the back cover 200. The groove 320h may be referred to as a receiving groove.

The side frame 320R may include a fastening hole 320hh. The fastening hole 320hh may be formed in the groove 320h (or the receiving groove 320h) of the side frame 320R.

One end of a lower frame 330B may be received in the groove 320h of the side frame 320R. One end of the lower frame 330B in the groove 320h of the side frame 320R may be coupled to the side frame 320R by screws.

The lower frame 330B may include a coupling portion 330BE. The coupling portion 330BE may have a shape corresponding to the groove 320h (or the receiving groove 320h). The lower frame 330B may include a coupling hole 330*h*. The coupling hole 330*h* may be formed in the coupling portion 330BE. As screws are inserted into the coupling hole 330*h* and the fastening hole 320*hh*, the lower frame 330B may be fixed or coupled to the side frame 320R.

Figure 14A:
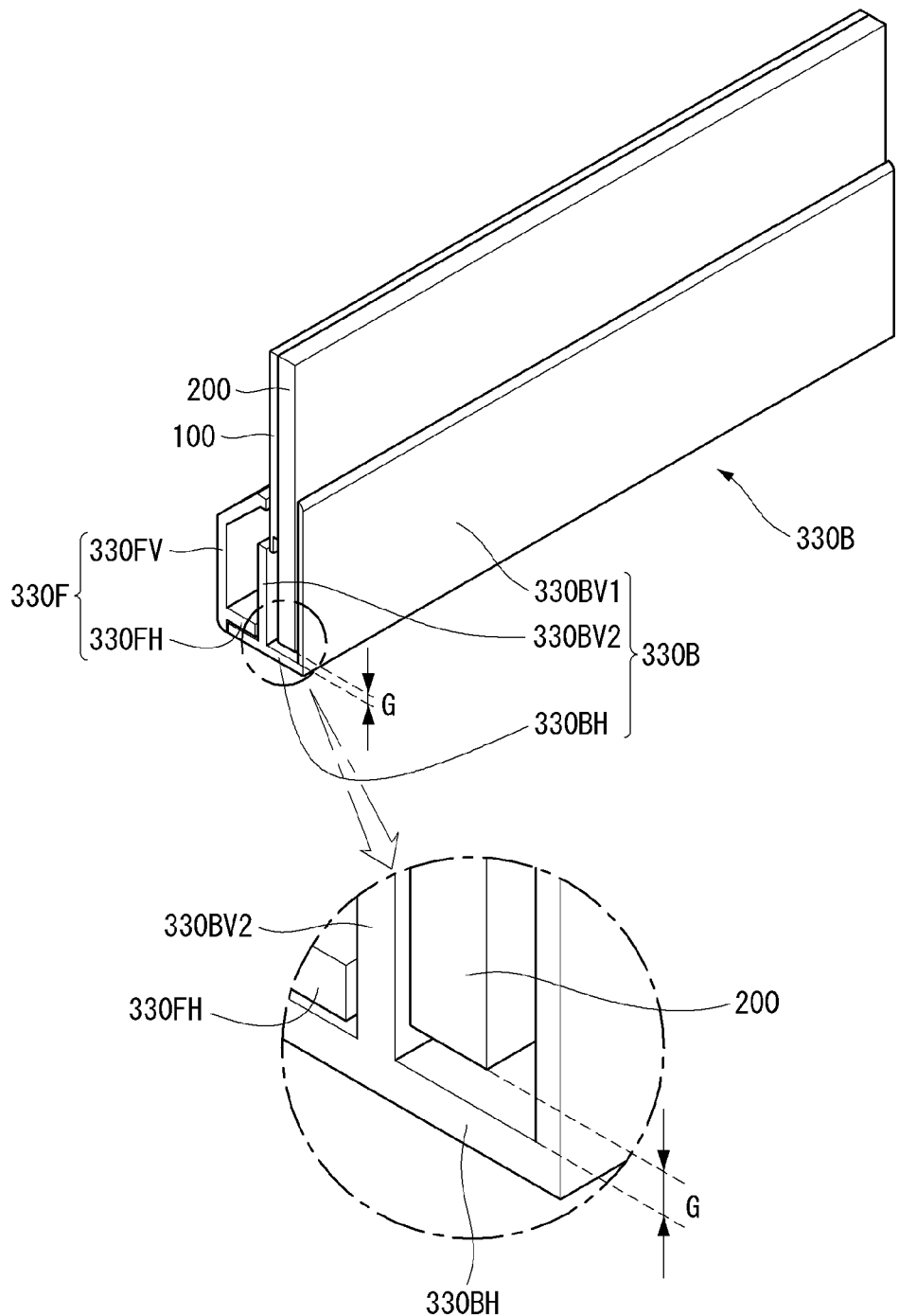

Referring to FIG. 14A, the lower frame 330B may include a horizontal portion 330BH and vertical portions 330BV1 and 330BV2. The horizontal portion 330BH may be positioned adjacent to the lower side of the back cover 200. In this instance, the horizontal portion 330BH may be spaced apart from a bottom surface of the back cover 200 by a predetermined distance. Namely, a gap G may be formed between the horizontal portion 330BH and the bottom surface of the back cover 200.

Hence, the lower frame 330B can prevent the display panel 100 or the back cover 200 from falling onto the lower side or being separated. Further, the lower frame 330B can prevent a damage of the display panel 100 or the back cover 200. In order to increase the above-described effects, a buffer member or an elastic material may be inserted into the gap G.

The vertical portions 330BV1 and 330BV2 may be extended to one surface of the back cover 200. The vertical portions 330BV1 and 330BV2 may cover a portion of one surface of the back cover 200. The vertical portions 330BV1 and 330BV2 may include a first vertical portion 330BV1 and a second vertical portion 330BV2. The display panel 100 or the back cover 200 may be positioned between the first vertical portion 330BV1 and the second vertical portion 330BV2. In other words, the display panel 100 or the back cover 200 may be inserted between the first vertical portion 330BV1 and the second vertical portion 330BV2.

A lower frame cover 330F may be coupled to the lower frame 330B. For example, the lower frame cover 330F may be magnetically coupled to the lower frame 330B. The lower frame cover 330F may include a horizontal portion 330FH and a vertical portion 330FV. The horizontal portion 330FH of the lower frame cover 330F may be coupled to the horizontal portion 330BH of the lower frame 330B. The vertical portion 330FV may cover another surface (not covered by the lower frame 330B) of the display panel 100 or the back cover 200. Hence, the lower frame cover 330F can prevent a damage of the display panel 100 or the back cover 200.

The back cover 200 may be positioned between the vertical portion 330BV1 of the lower frame 330B and the vertical portion 330FV of the lower frame cover 330F. The display panel 100 may be positioned between the back cover 200 and the vertical portion 330FV of the lower frame cover 330F.

Figure 14B:
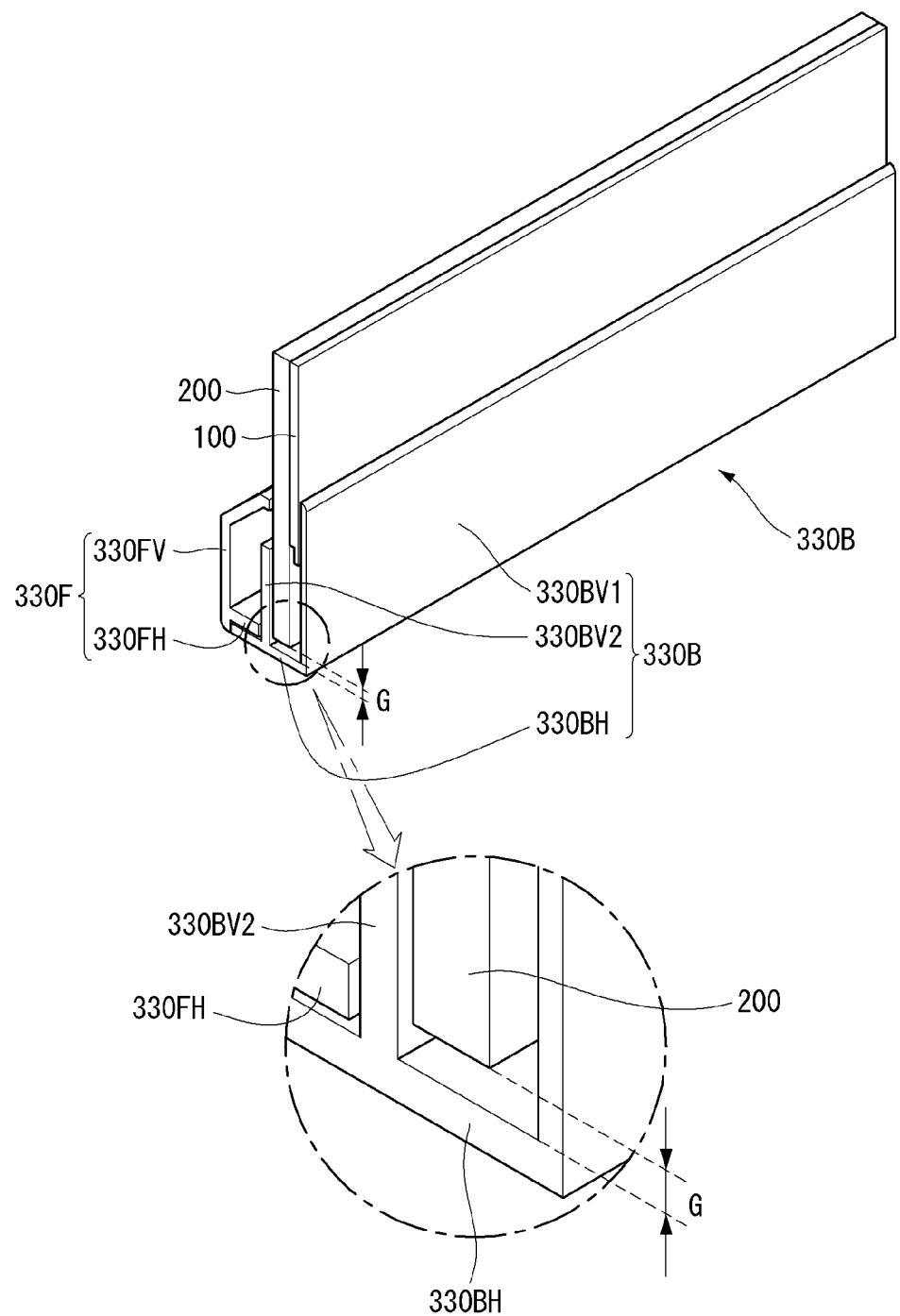

Referring to FIG. 14B, formation locations of the display panel 100 and the back cover 200 may be changed unlike FIG. 14A. The back cover 200 may be positioned between the vertical portion 330BV1 of the lower frame 330B and the vertical portion 330FV of the lower frame cover 330F, and the display panel 100 may be positioned between the back cover 200 and the vertical portion 330BV1 of the lower frame 330B.

Figure 15:
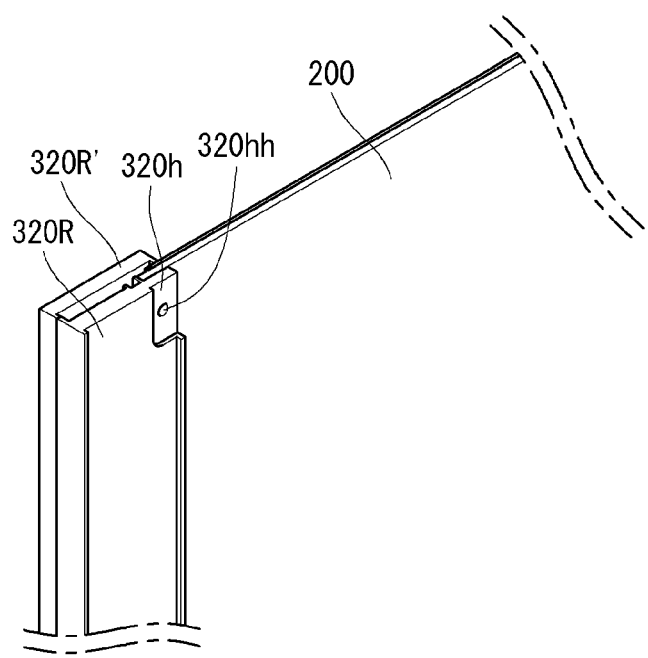
Figure 16:
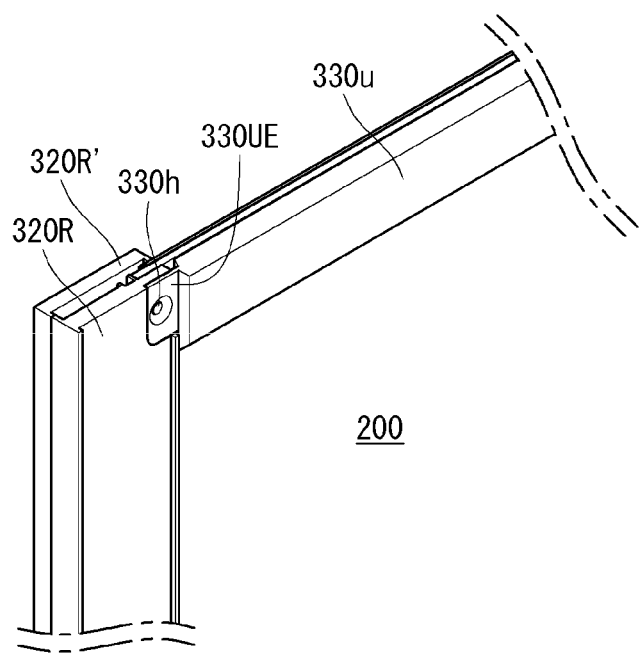

Referring to FIGS. 15 and 16, a side frame 320R may include a groove 320*h*. The groove 320*h* may be formed at an upper part or an upper end of the side frame 320R. The groove 320*h* of the side frame 320R may be positioned adjacent to the upper end of the display panel 100 or the back cover 200. The groove 320*h* may be referred to as a receiving groove.

The side frame 320R may include a fastening hole 320*hh*. The fastening hole 320*hh* may be formed in the groove 320*h* (or the receiving groove 320*h*) of the side frame 320R.

One end of an upper frame 330U may be received in the groove 320*h* of the side frame 320R. One end of the upper frame 330U in the groove 320*h* of the side frame 320R may be coupled to the side frame 320R by screws.

The upper frame 330U may include a coupling portion 330UE. The coupling portion 330UE may have a shape corresponding to the groove 320*h* (or the receiving groove 320*h*). The upper frame 330U may include a coupling hole 330*h*. The coupling hole 330*h* may be formed in the coupling portion 330UE. As screws are inserted into the coupling hole 330*h* and the fastening hole 320*hh*, the upper frame 330U may be fixed or coupled to the side frame 320R.

Hence, the display device according to the embodiment of the invention can sufficiently secure the rigidity against an impact or an external force that may be generated in the up-down direction of the display device.

Figure 17:
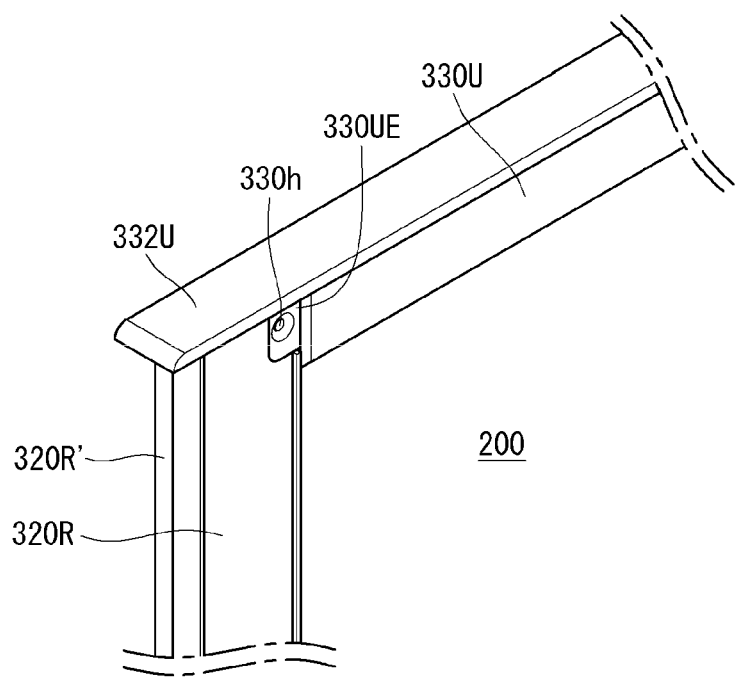

Referring to FIG. 17, an upper cover 332U may cover upper ends or upper surfaces of the side frame 320R and/or the upper frame 330U. The upper cover 332U may cover all of the upper surface of the side frame 320R and the upper surface of the upper frame 330U, or may be wider than the upper surfaces. In other words, the upper cover 332U may have an area larger than the upper surface of the side frame 320R and the upper surface of the upper frame 330U. The upper cover 332U may be coupled to the side frame 320R and/or the upper frame 330U by a magnet.

Figure 18:
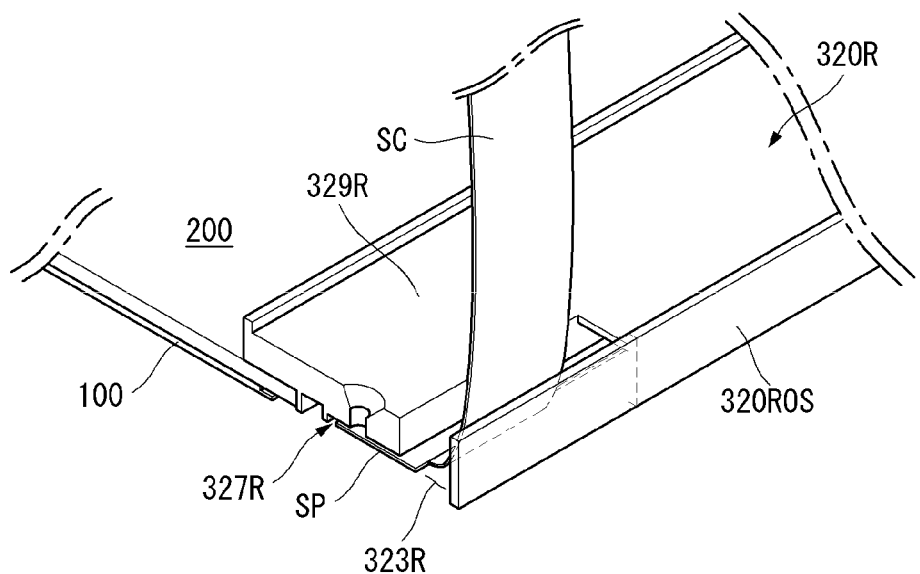
FIGS. 18, 19, 20, 21, 22, 23, 24, and 25 illustrate examples of wiring of a display device according to an embodiment of the invention.

Referring to FIG. 18, the side frame 320R may include a first surface 327R and a second surface 329R. The first surface 327R may be a front surface or a back surface of the side frame 320R, and the second surface 329R may be the back surface or the front surface of the side frame 320R.

A passage 323R may be formed between the first surface 327R and the second surface 329R. The first surface 327R may be connected to the second surface 329R through the passage 323R. The passage 323R may be formed inside the side frame 320R. The passage 323R may be formed by removing a portion of the side frame 320R so that the first surface 327R and the second surface 329R communicate with each other.

The passage 323R may be positioned adjacent to an external surface 320ROS of the side frame 320R. Namely, the passage 323R may be formed in a portion of the side frame 320R away from the display panel 100.

A PCB SP may be positioned on the first surface 327R. A cable SC may be extended from the PCB SP to the second surface 329R. In this instance, the cable SC may pass through the passage 323R. The cable SC may be arranged on the second surface 329R while passing through the passage 323R from the first surface 327R.

Figure 19:
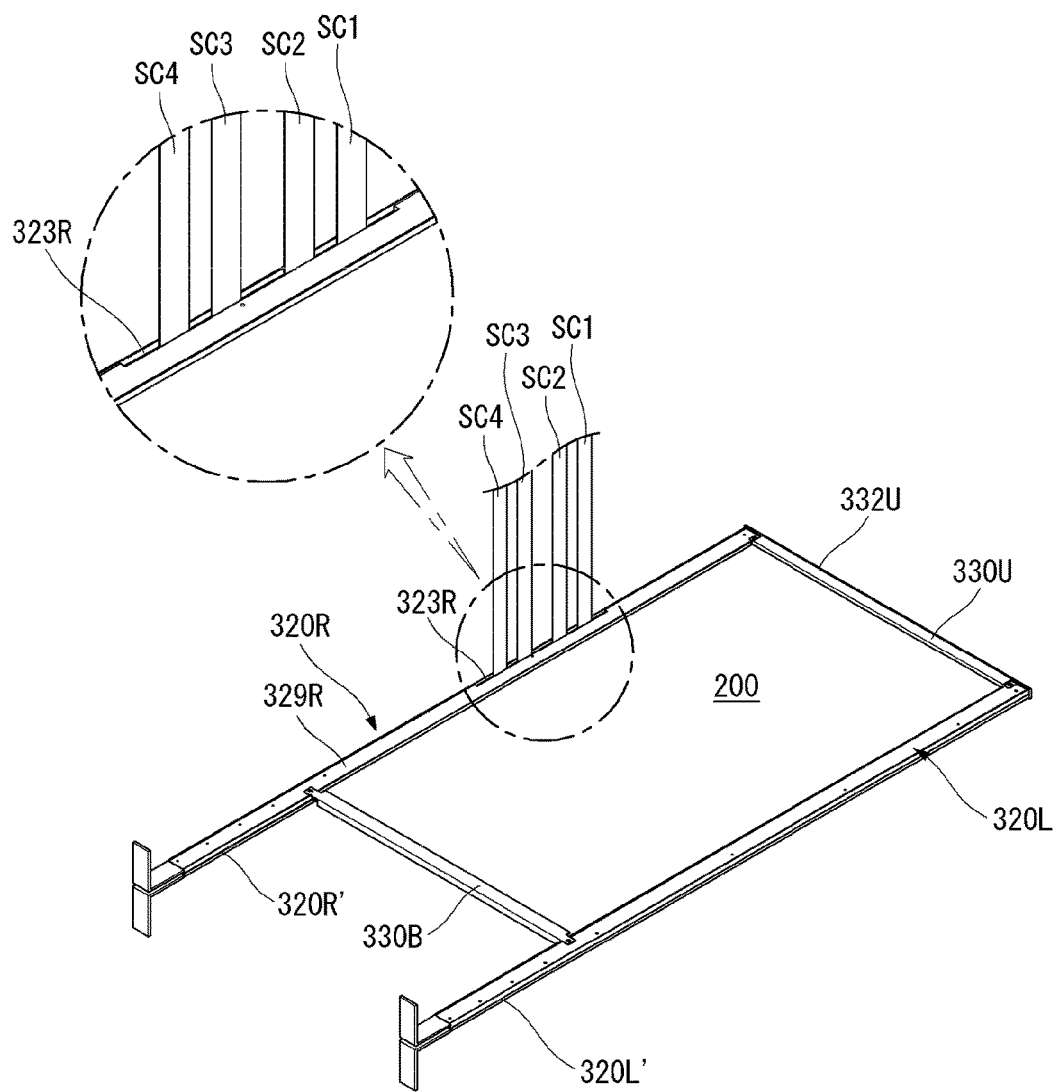

Referring to FIG. 19, a plurality of cables SC may be arranged from the first surface 327R to the second surface 329R. The plurality of cables SC may pass through the passage 323R and may be positioned on the second surface 329R. The plurality of cables SC may include a first cable SC1, a second cable SC2, a third cable SC3, and a fourth cable SC4. The first to fourth cables SC1 to SC4 may be sequentially arranged on the passage 323R. A length of the passage 323R may be greater than a sum of widths of the first to fourth cables SC1 to SC4.

Figure 20:
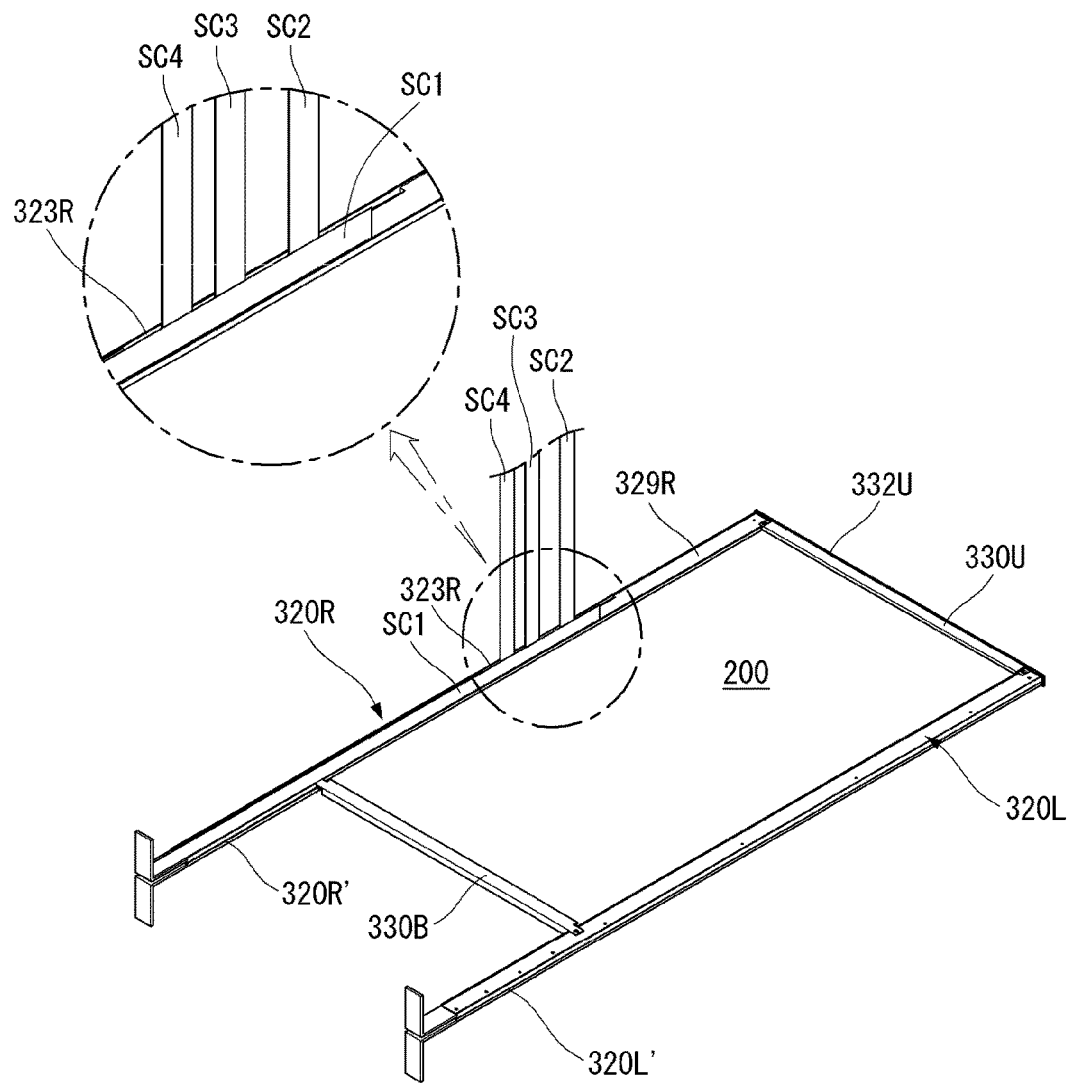

Referring to FIG. 20, the first cable SC1 may pass through the passage 323R and may bend or fold on the second surface 329R. The first cable SC1 may be arranged along the second surface 329R. Namely, the first cable SC1 may be positioned on the second surface 329R along a longitudinal direction of the side frame 320R.

Figure 21:
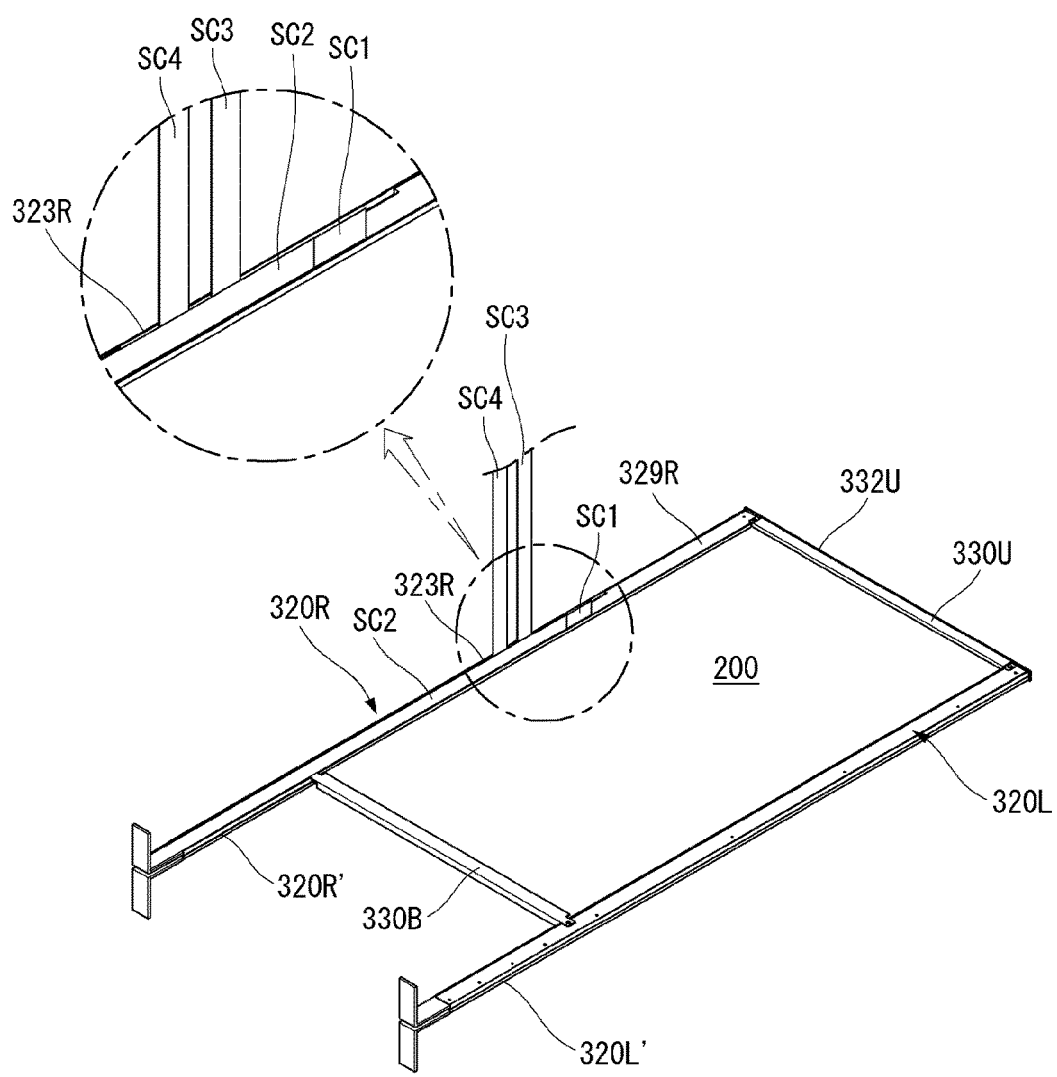

Referring to FIG. 21, the second cable SC2 may pass through the passage 323R and may bend or fold on the second surface 329R. The second cable SC2 may be arranged along the second surface 329R. Namely, the second cable SC2 may be positioned on the second surface 329R or the first cable SC1 along the longitudinal direction of the side frame 320R.

Figure 22:
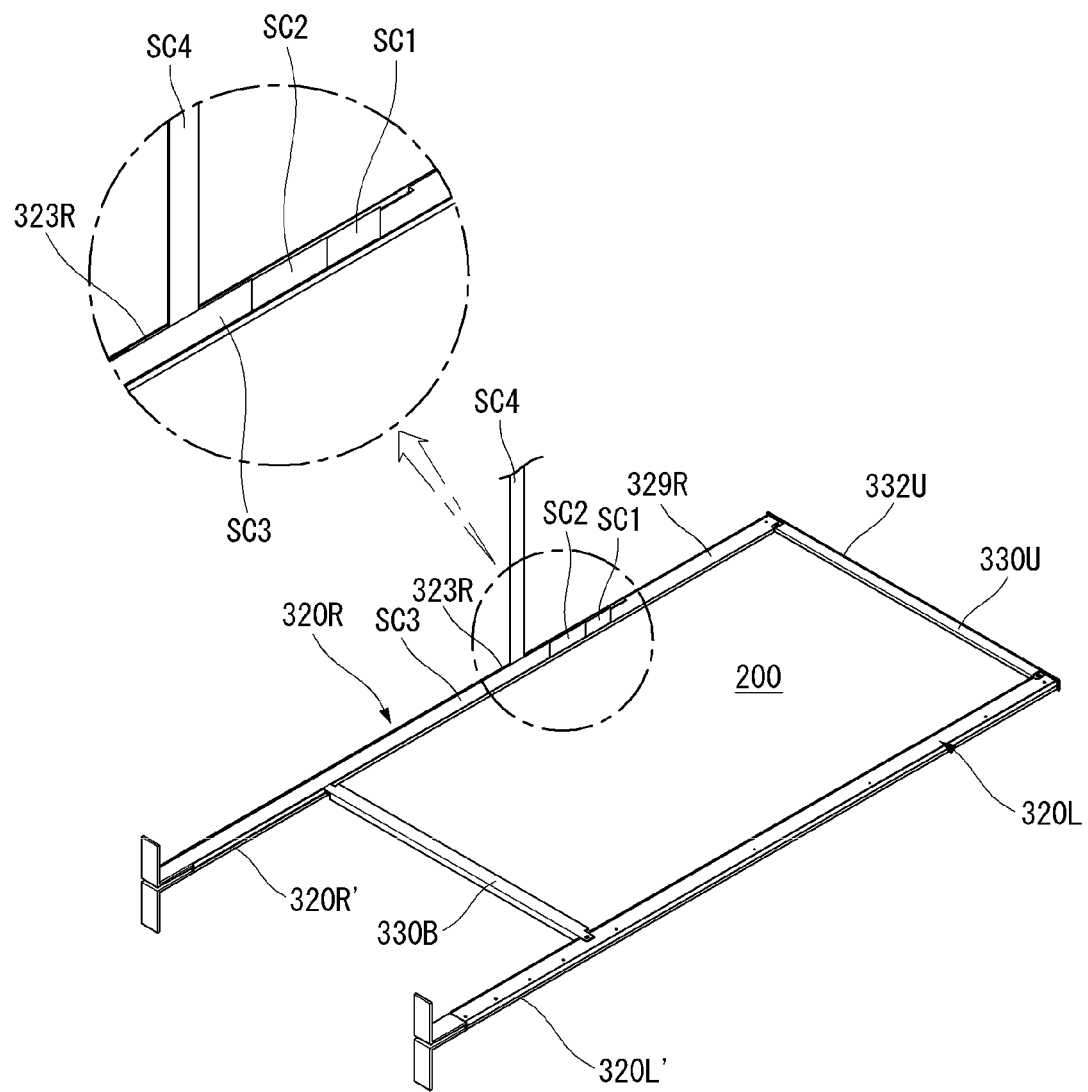

Referring to FIG. 22, the third cable SC3 may pass through the passage 323R and may bend or fold on the second surface 329R. The third cable SC3 may be arranged along the second surface 329R. Namely, the third cable SC3 may be positioned on the second surface 329R, the first cable SC1, or the second cable SC2 along the longitudinal direction of the side frame 320R.

Figure 23:
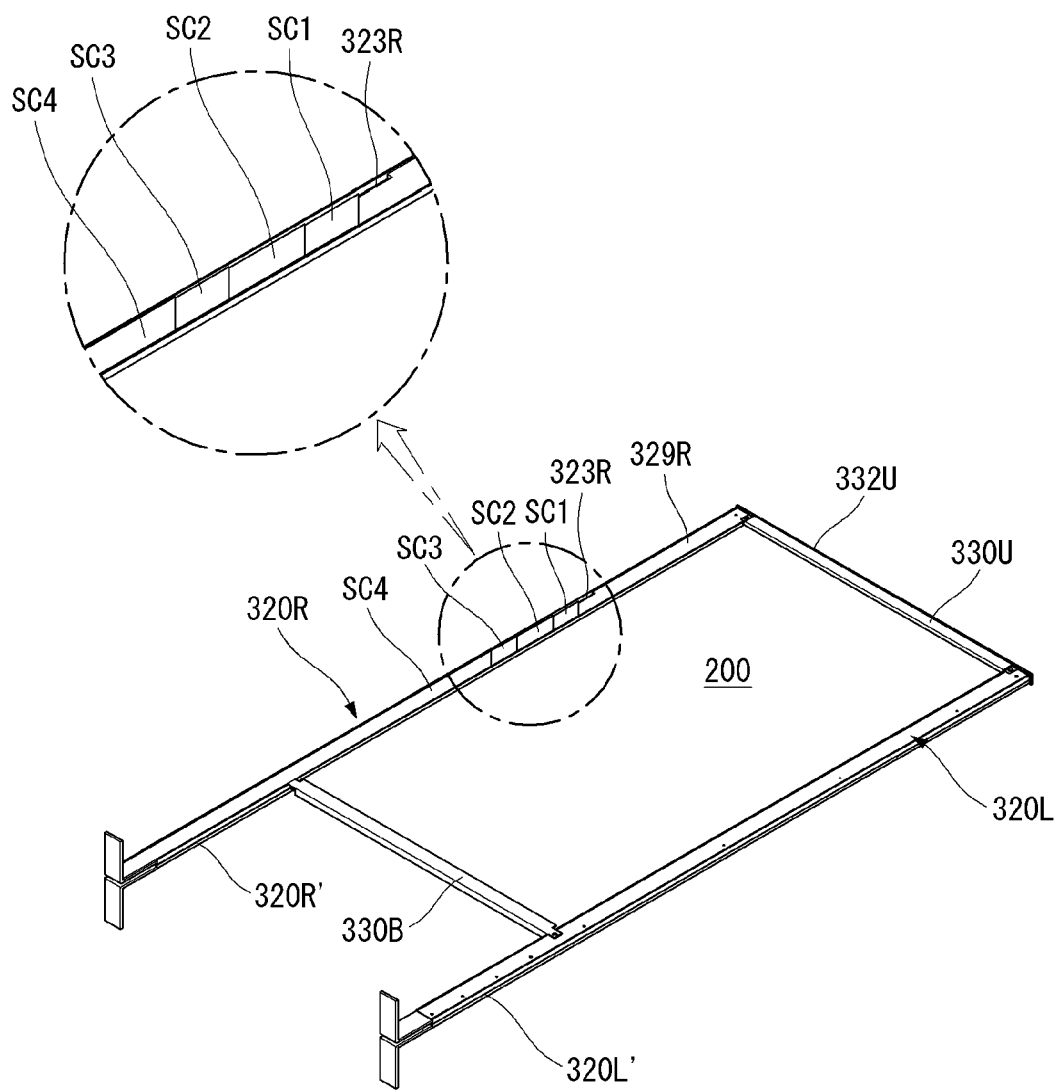

Referring to FIG. 23, the fourth cable SC4 may pass through the passage 323R and may bend or fold on the second surface 329R. The fourth cable SC4 may be arranged along the second surface 329R. Namely, the fourth cable SC4 may be positioned on the second surface 329R, the first cable SC1, the second cable SC2, or the third cable SC3 along the longitudinal direction of the side frame 320R.

An arrangement order of the above-described cables SC may be changed.

Figure 24:
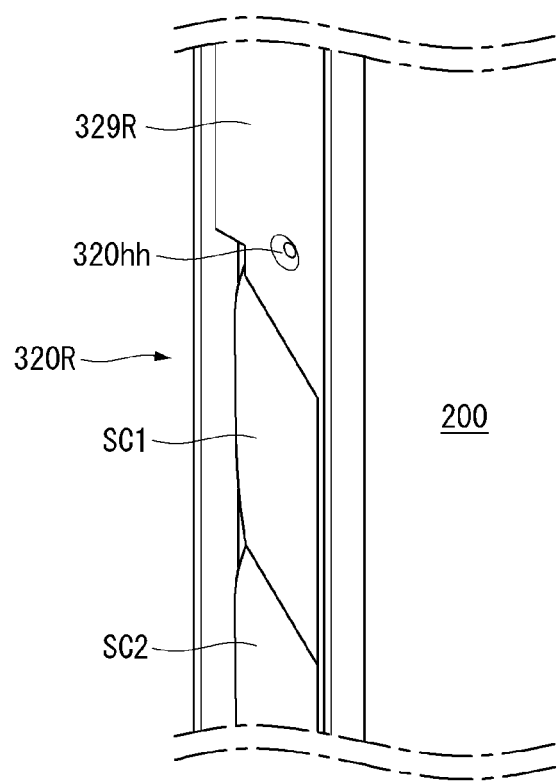
Figure 25:
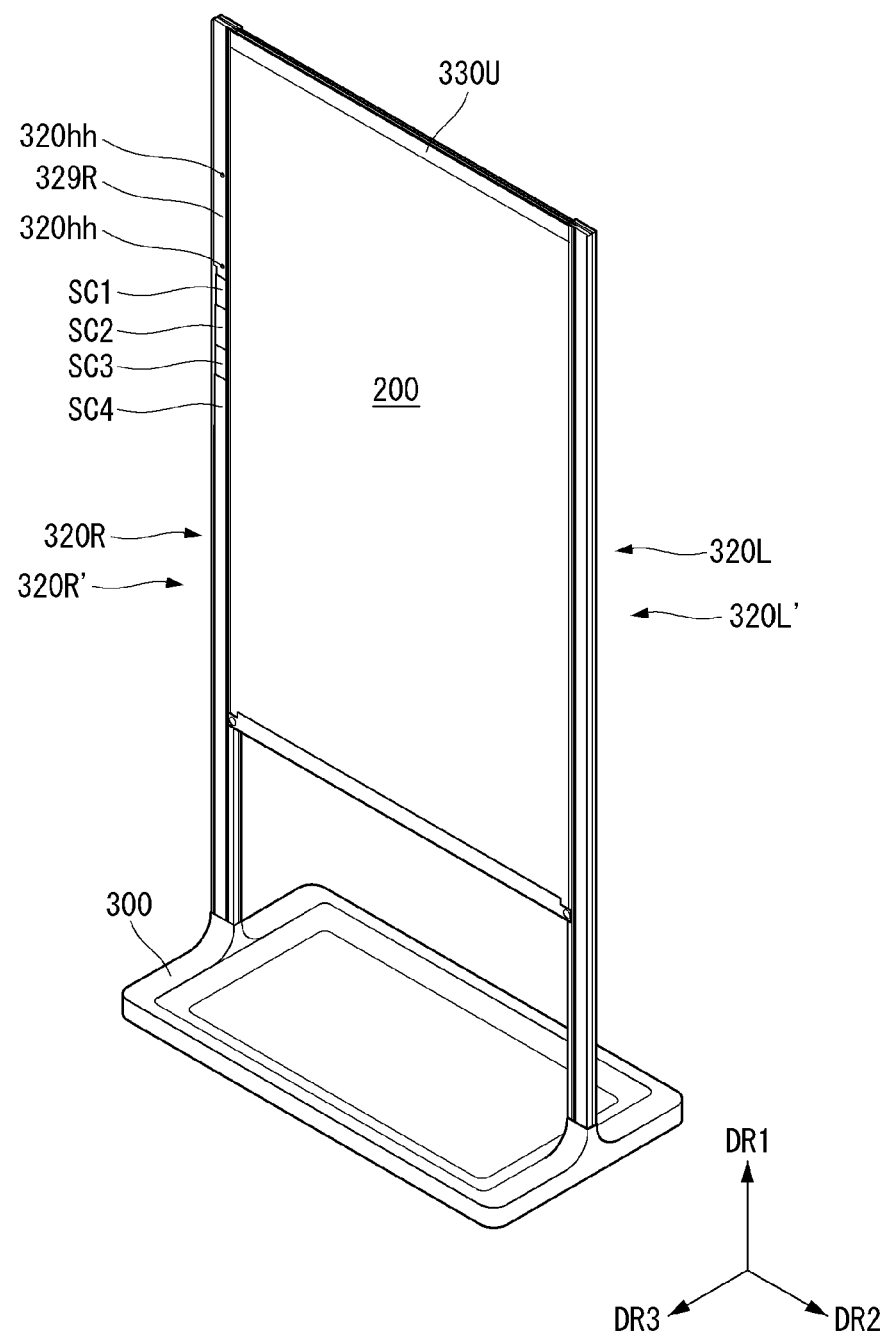

Referring to FIGS. 24 and 25, the cables SC may overlap one another. For example, the second cable SC2 may be stacked on the first cable SC1. In this instance, the second cable SC2 may contact the first cable SC1. The third cable SC3 may be stacked on the first cable SC1 and/or the second cable SC2. In this instance, the third cable SC3 may contact the second cable SC2. The fourth cable SC4 may be stacked on the first cable SC1, the second cable SC2, and/or the third cable SC3. In this instance, the fourth cable SC4 may contact the third cable SC3.

A fastening hole 320*hh* may be formed on the second surface 329R of the side frame 320R. In this instance, the fastening hole 320*hh* may be formed adjacent to the first to fourth cables SC1 to SC4, but the first to fourth cables SC1 to SC4 may not overlap one another adjacent to the fastening hole.

The first to fourth cables SC1 to SC4 may be arranged toward the lower part of the side frame 320R along the longitudinal direction of the side frame 320R. The first to fourth cables SC1 to SC4 may be extended to a control unit 300 (or an AV box 300) positioned at the lower end of the side frame 320R.

Figure 26:
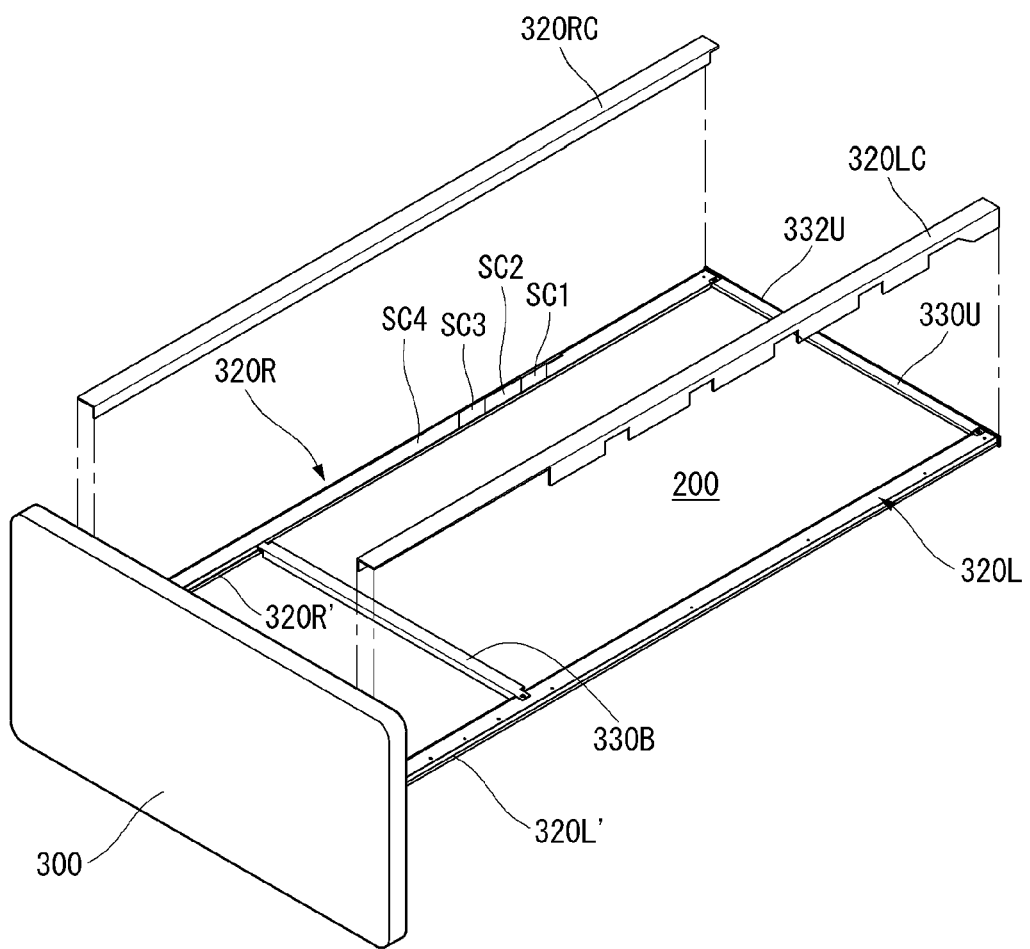
FIGS. 26, 27, 28, 29, and 30 illustrate examples of a side frame of a display device according to an embodiment of the invention.

Referring to FIG. 26, side frame covers 320RC and 320LC may cover side frames 320R and 320L. The side frame covers 320RC and 320LC may be referred to as a side cover. The side frame covers 320RC and 320LC may cover front surfaces or back surfaces of the side frames 320R and 320L. In this instance, the front surfaces or the back surfaces of the side frames 320R and 320L may be surfaces on which the cables SC are arranged.

The first side frame cover 320RC may cover one surface of the first side frame 320R or the cable SC arranged on the one surface. The second side cover 320LC may cover one surface of the second side frame 320L.

Figure 27:
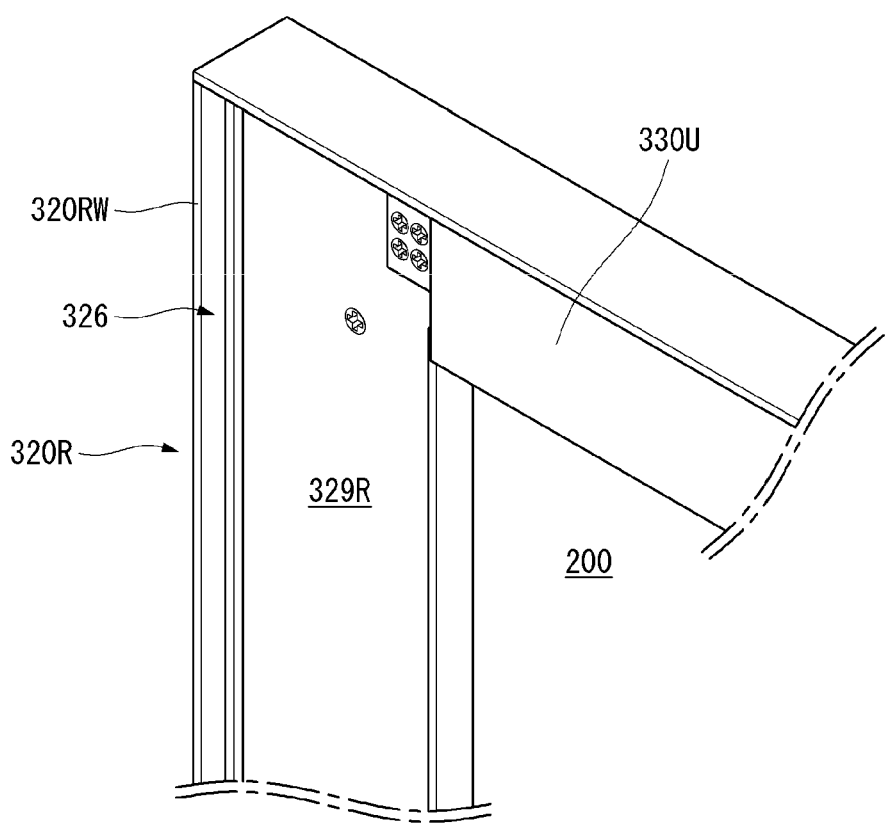

Referring to FIG. 27, the side frame 320R may include a side groove 326. The side groove 326 may be formed to be extended in a portion of the side frame 320R. The side groove 326 may be formed between the second surface 329R of the side frame 320R and an external surface of the side frame 320R. The side frame 320R may include a side wall 320RW. The side groove 326 may be formed between the side wall 320RW and the front surface or the back surface of the side frame 320R. For example, the side groove 326 may be positioned between the side wall 320RW and the second surface 329R of the side frame 320R.

Figure 28:
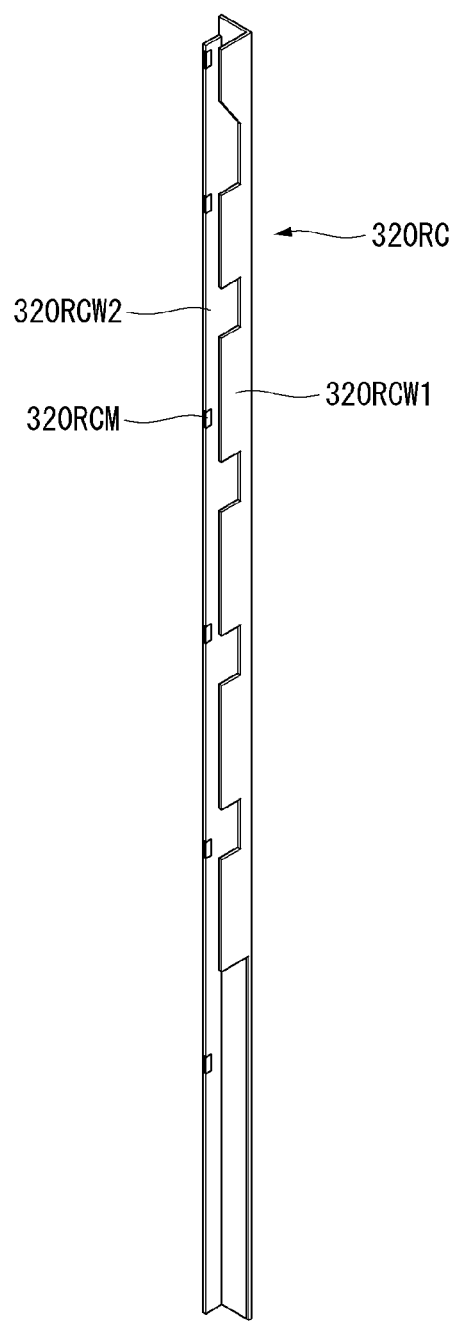

Referring to FIG. 28, the side frame cover 320RC may cover the side frame 320R. In this instance, a portion of the side frame cover 320RC may be inserted into the side groove 326. The side frame cover 320RC may include side walls 32ORCW1 and 320RCW2. The side walls 32ORCW1 and 320RCW2 may form one side of the side frame cover 320RC. The side walls 32ORCW1 and 320RCW2 may be disposed successively or intermittently. The side walls 32ORCW1 and 320RCW2 may include a first side wall 32ORCW1 and a second side wall 320RCW2.

When the side frame cover 320RC covers one surface of the side frame 320R, the first side wall 32ORCW1 may be inserted into the side groove 326. A magnetic portion 32ORCM may be positioned on the second side wall 320RCW2. The magnetic portion 32ORCM may be used to fix or couple the side frame cover 320RC to the side frame 320R when the side frame cover 320RC covers the side frame 320R. Hence, a space required to couple the side frame 320R and the side frame cover 320RC can be minimized, and the side frame 320R and the side frame cover 320RC is easily detachable from each other.

Figure 29:
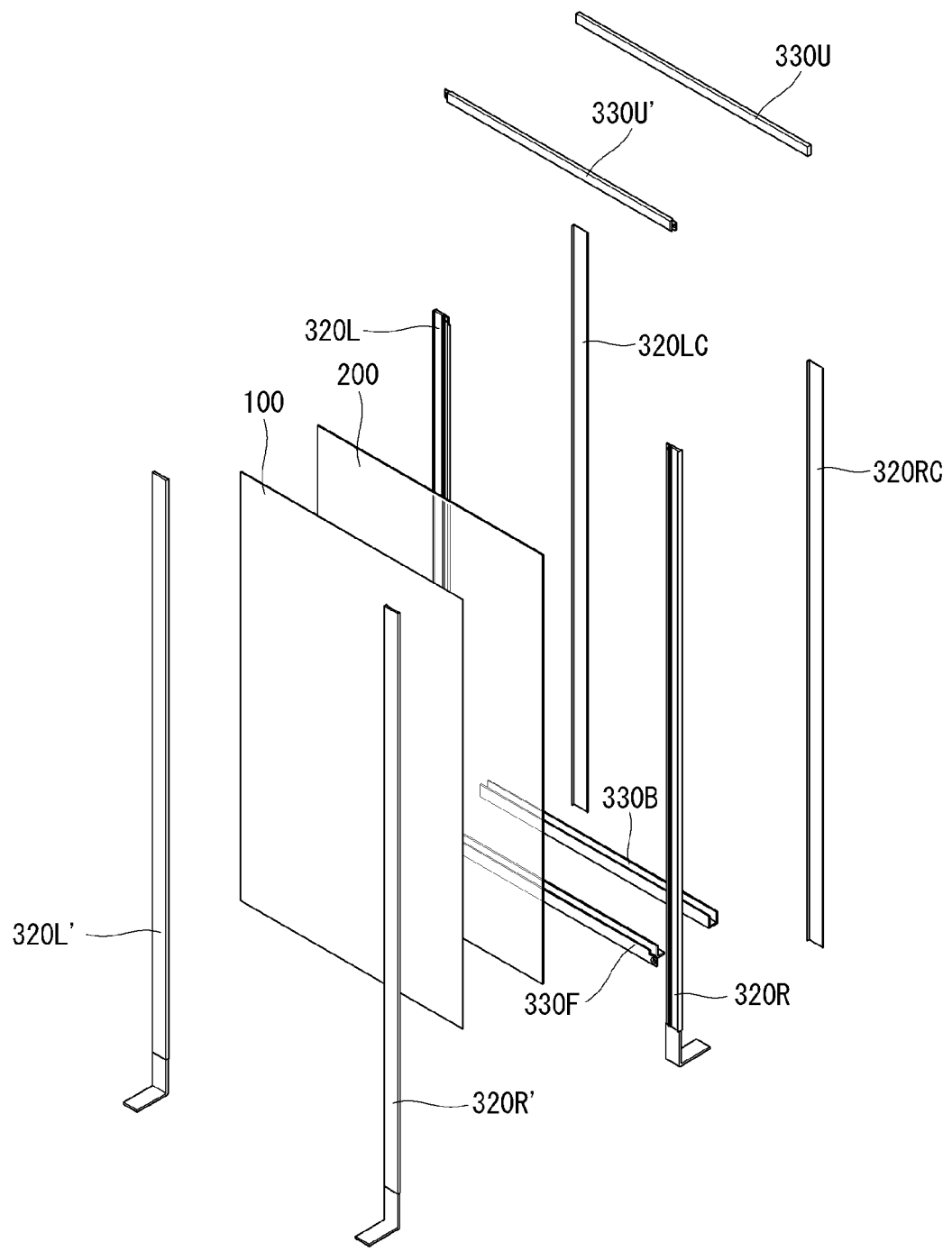

Referring to FIG. 29, the first side frame 320R may face the third side frame 320R' and may be spaced apart from the second side frame 320L in parallel with the second side frame 320L. Further, the second side frame 320L may face the fourth side frame 320L'.

One side of the display panel 100 and one side of the back cover 200 may be positioned or fixed between the first side frame 320R and the third side frame 320R'. The other side of the display panel 100 and the other side of the back cover 200 may be positioned or fixed between the second side frame 320L and the fourth side frame 320L'.

The first upper frame 330U' may be fastened or fixed to the third side frame 320R' and the fourth side frame 320L', and the second upper frame 330U may be fastened or fixed to the first side frame 320R and the second side frame 320L.

The lower frame 330B may be fastened or fixed to the first side frame 320R and the second side frame 320L. The lower frame cover 330F may be coupled to the lower frame 330B at the third side frame 320R' and the fourth side frame 320L'.

Hence, a support structure of the display panel 100 and/or the back cover 200 can be formed, and sufficient rigidity can be secured.

The first side frame cover 320RC may cover the cable SC arranged on the first side frame 320R and may be coupled to the first side frame 320R. The second side cover 320LC may cover the cable SC arranged on the second side frame 320L and may be coupled to the second side frame 320L.

Lower ends of the first to fourth side frames 320R, 320L, 320R', and 320L' may be fixed to bases 303R and 303L of the control unit 300 that will be described later, and may be supported by supporters 306a and 306b.

Figure 30:
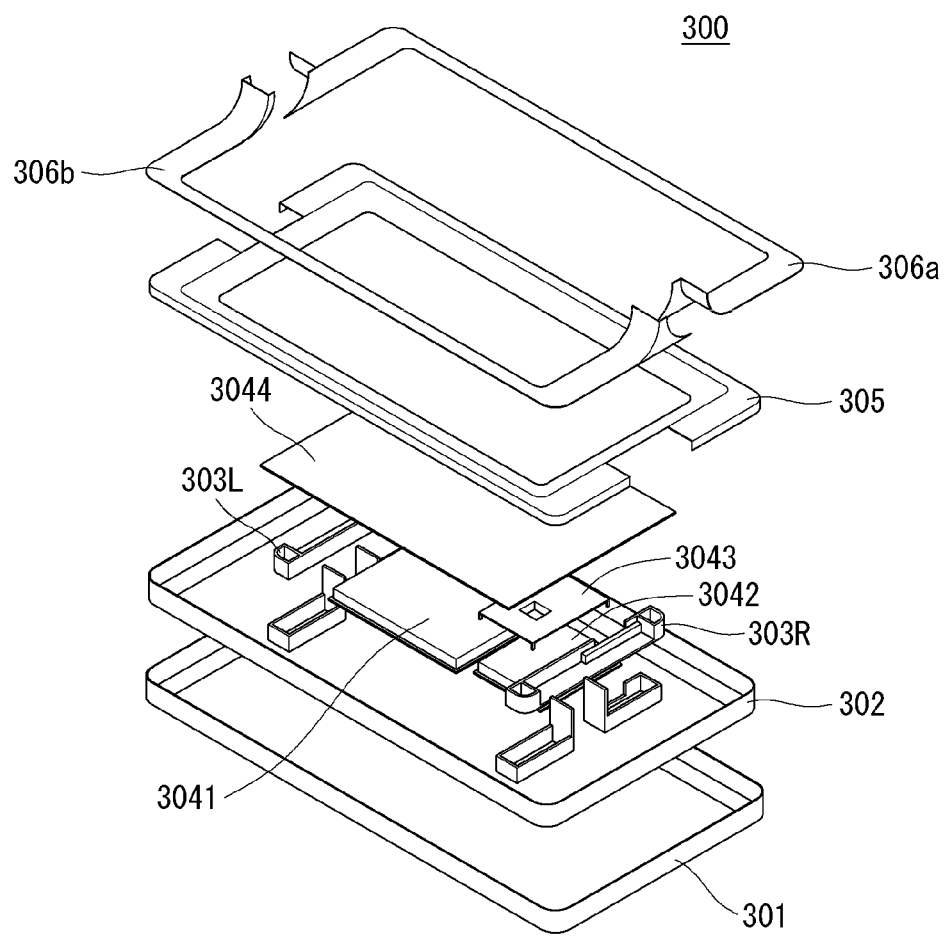

Referring to FIG. 30, the control unit 300 may include a stand and a controller. The stand may include a stand case 301, a stand cover 305, the bases 303R and 303L, and the supporters 306a and 306b. The stand cover 305 may cover the stand case 301, and the bases 303R and 303L may be installed or fixed inside the stand case 301. The side frames 320R and 320L may be coupled or fixed to the bases 303R and 303L. To this end, the bases 303R and 303L may include a material with high weight. The supporters 306a and 306b may be mounted on an upper side of the stand cover 305. The supporters 306a and 306b may support the side frames 320R and 320L.

The supporters 306a and 306b may partially cover the cable SC or a portion of the plurality of cables SC1, SC2, SC3, and SC4. Namely, the cable SC or the plurality of cables SC1, SC2, SC3, and SC4 may be partially exposed to the outside, so that the cable SC or the plurality of cables SC1, SC2, SC3, and SC4 is connected to the control unit 300 at one end of each of the side frames 320R and 320R'. The supporters 306a and 306b may cover this.

Controllers 3041 and 3042 may be installed or mounted inside the stand case 301. The controllers 3041 and 3042 may include a power supply board, a main board, a T-CON board, etc. The controllers 3041 and 3042 may be electrically connected to the cable SC described above.

A base 302 comprising a metal material may be added to an upper surface of the stand case 301 so as to securely fix the display device or increase the weight of the control unit 300 for better stability of display device. Further, a plate 3044 for heat dissipation of the controllers 3041 and 3042 may be positioned on the controllers 3041 and 3042. In addition, a plate 3043 may be added to efficiently dissipate high temperature heat generated in the main board 3042 included in the controllers 3041 and 3042.

The plates 3043 and 3044 may absorb heat generated in the controllers 3041 and 3042 and may transfer the heat to the outside of the control unit 300 through the stand cover 305.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel;
   a transparent back cover disposed at a rear of the display panel;
   a first side frame disposed at a first side of the display panel and elongated along the first side, wherein the first side frame comprises a passage opening passing through a first side of the first side frame to a second side of the first side frame and the first side of the first side frame is opposite to the second side of the first side frame;
   a cable electrically coupled to the display panel and extended along the first side frame, wherein the cable is passed through the passage opening;
   a first side frame cover configured to cover the second side of the first side frame; and
   a control unit, wherein the cable is electrically coupled to the control unit disposed at an end of the first side frame.

2. The display device of claim 1, wherein the cable is bent at a surface edge of the first side frame.

3. The display device of claim 1, wherein the cable is bent at a surface edge defining the passage opening at the second side of the first side frame.

4. The display device of claim 1, wherein the first side frame cover is magnetically coupled to the first side frame.

5. The display device of claim 1, comprising a plurality of overlapping cables extended along the first side frame.

6. The display device of claim 1, further comprising a second side frame coupled to the first side frame, wherein the display panel or the transparent back cover is disposed between the first side frame and the second side frame.

7. The display device of claim 6, further comprising:
   a member layer coupled to the first side of the display panel;
   a printed circuit board coupled to the member layer; and
   a cable coupled to the printed circuit board,
   wherein the printed circuit board is disposed between the first side frame and the second side frame.

8. The display device of claim 7, wherein:
   the printed circuit board is disposed at the first side of the first side frame; and
   the cable is passed through the passage opening and disposed at the second side of the first side frame.

9. The display device of claim 8, comprising a plurality of cables, wherein:
   the plurality of cables are passed through the passage opening such that the plurality of cables do not overlap; and
   each of the plurality of cables are bent at a surface edge of the second side of the first side frame defining the passage opening such that the plurality of cables overlap along the second side of the first side frame.

10. The display device of claim 8, wherein the passage opening is defined adjacent to a lateral side of the first side frame away from the display panel.

11. The display device of claim 1, further comprising:
    a second side frame coupled to the first side frame, wherein the display panel or the transparent back cover is disposed between the first side frame and the second side frame; and
    a lower frame coupled to the first side frame and the second side frame and disposed at a lower portion of the transparent back cover,
    wherein the lower frame is spaced apart from a bottom surface of the transparent back cover.

12. The display device of claim 1, further comprising:
    a second side frame coupled to the first side frame; and
    a third side frame coupled to a fourth side frame disposed at a second side of the display panel opposite the first side,
    wherein the display panel or the transparent back cover is disposed between the first side frame and the second side frame and between the third side frame and the fourth side frame.

13. The display device of claim 12, wherein the first side frame and the third side frame each comprise a groove configured to abut a bottom surface of the transparent back cover.

14. The display device of claim 12, further comprising a base comprising a control unit, wherein:
    the cable is electrically coupled to the control unit; and
    the base is coupled to the first side frame, the second side frame, the third side frame, and the fourth side frame.

15. The display device of claim 14, wherein the display panel is positioned in a portrait configuration.

16. The display device of claim 12, further comprising a lower frame comprising a first vertical wall and a second vertical wall, wherein the transparent back cover is disposed between the first vertical wall and the second vertical wall.

17. The display device of claim 16, wherein:
the lower frame comprises a horizontal support protruding at a base of the first vertical wall; and
the display device further comprises a lower frame cover magnetically coupled to the horizontal support.

* * * * *